(12) United States Patent
Lee et al.

(10) Patent No.: US 8,811,094 B2
(45) Date of Patent: Aug. 19, 2014

(54) NON-VOLATILE MULTI-LEVEL MEMORY DEVICE AND DATA READ METHOD

(75) Inventors: Ji-Sang Lee, Suwon-Si (KR); Ki Hwan Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 177 days.

(21) Appl. No.: 13/528,886

(22) Filed: Jun. 21, 2012

(65) Prior Publication Data

US 2013/0064013 A1    Mar. 14, 2013

(30) Foreign Application Priority Data

Sep. 9, 2011    (KR) .................. 10-2011-0092243

(51) Int. Cl.
| | |
|---|---|
| *G11C 16/16* | (2006.01) |
| *G11C 16/10* | (2006.01) |
| *G11C 11/56* | (2006.01) |
| *G11C 16/34* | (2006.01) |
| *G11C 16/14* | (2006.01) |

(52) U.S. Cl.
CPC ............ *G11C 11/5628* (2013.01); *G11C 16/16* (2013.01); *G11C 16/10* (2013.01); *G11C 16/3418* (2013.01); *G11C 168/0483* (2013.01); *G11C 16/14* (2013.01)
USPC .................. 365/185.29; 365/218; 365/185.22

(58) Field of Classification Search
CPC .... G11C 16/16; G11C 16/14; G11C 16/3445; G11C 16/344; H01L 27/115
USPC ................................. 365/185.29, 218, 185.22
See application file for complete search history.

(56) References Cited

U.S. PATENT DOCUMENTS

| | | | |
|---|---|---|---|
| 7,301,810 B2 | 11/2007 | Chen | |
| 7,372,730 B2 | 5/2008 | Chen | |
| 7,843,724 B2 | 11/2010 | Shiga et al. | |
| 2004/0174747 A1* | 9/2004 | Tanaka et al. | ............ 365/185.22 |
| 2011/0044106 A1 | 2/2011 | Shiga et al. | |

FOREIGN PATENT DOCUMENTS

| | | |
|---|---|---|
| JP | 2008-084485 | 4/2008 |
| KR | 1020090117713 A | 11/2009 |

* cited by examiner

*Primary Examiner* — Jason Lappas
(74) *Attorney, Agent, or Firm* — Volentine & Whitt, PLLC

(57) ABSTRACT

A non-volatile memory device, a data read method thereof and a recording medium are provided. The method includes receiving a data read command for a first word line in a memory cell array, reading data from a second word line adjacent to the first word line, and reading data from the first word line using a different voltage according to a state of the data read from the second word line. The number of read voltages used to distinguish an erased state and a first programmed state is greater than the number of read voltages used to distinguish a second programmed state and a third programmed state.

15 Claims, 46 Drawing Sheets

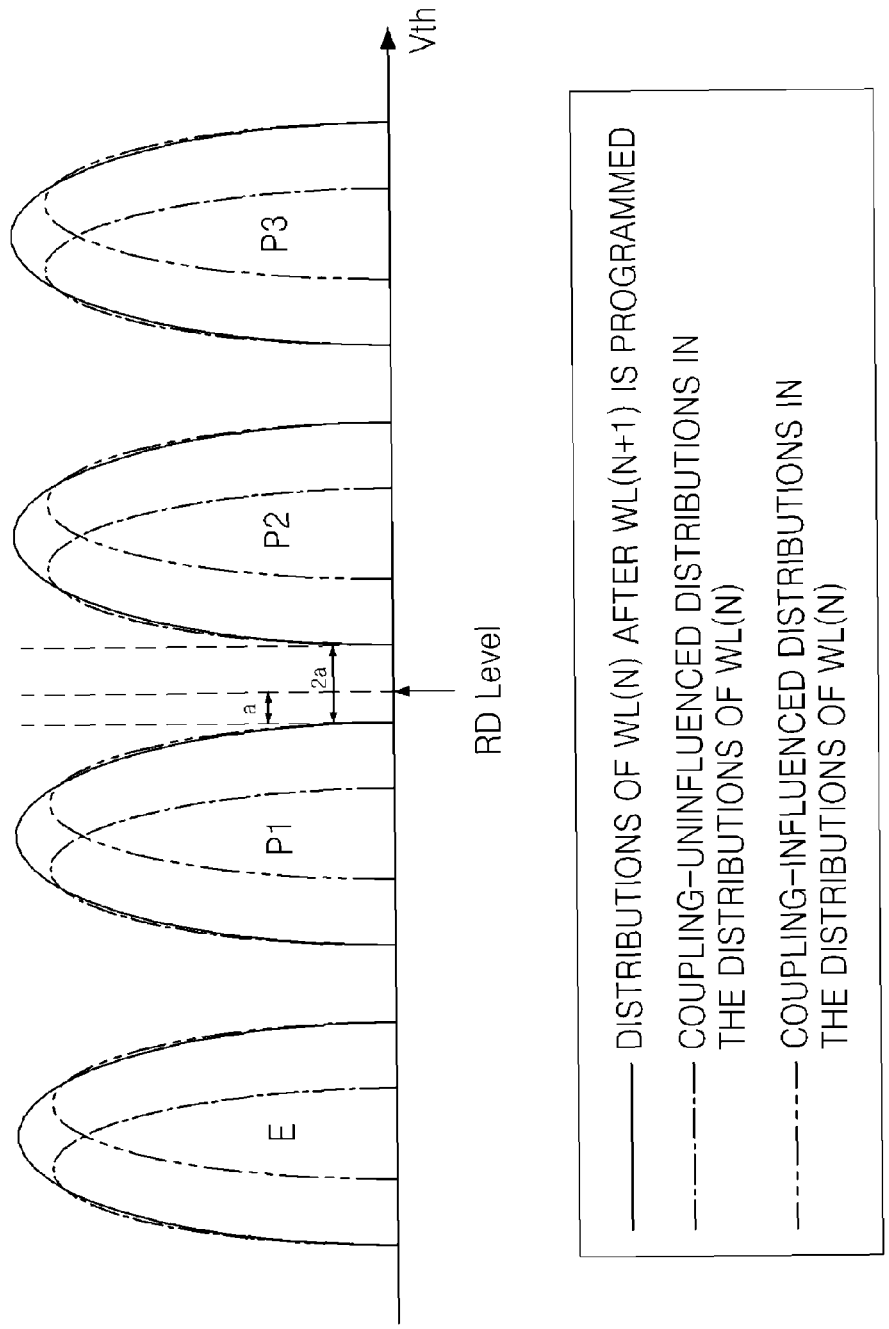

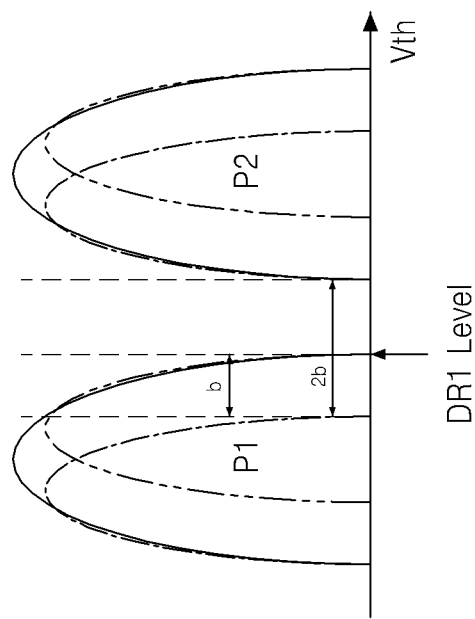

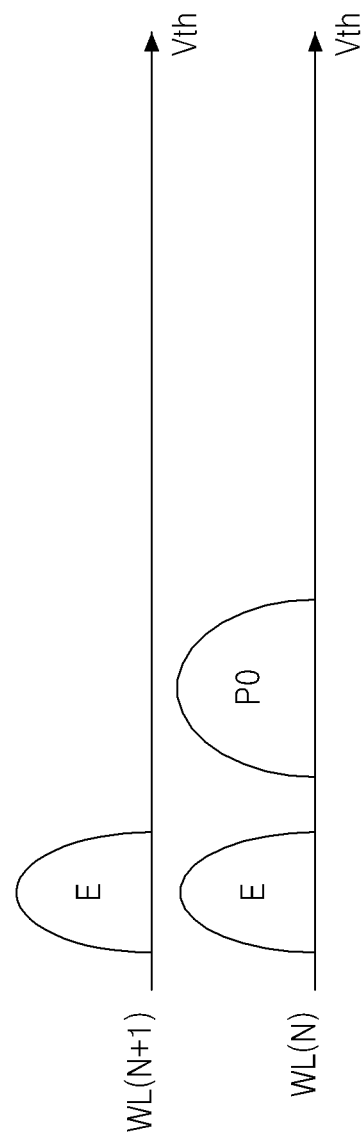

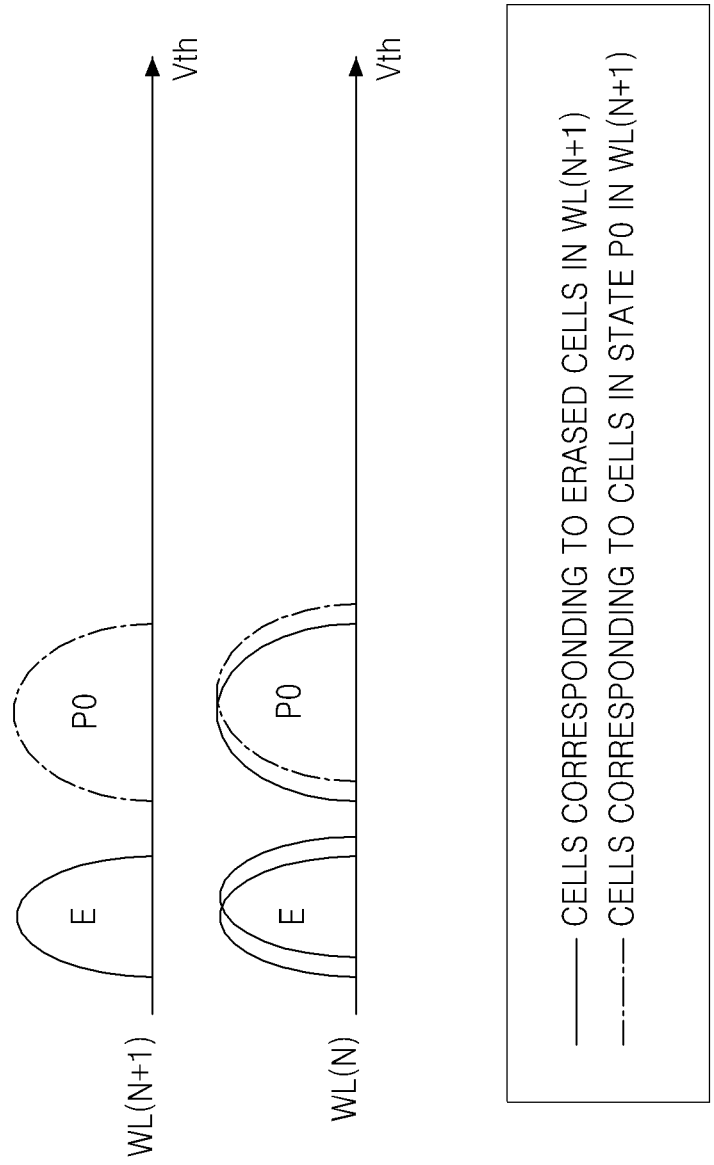

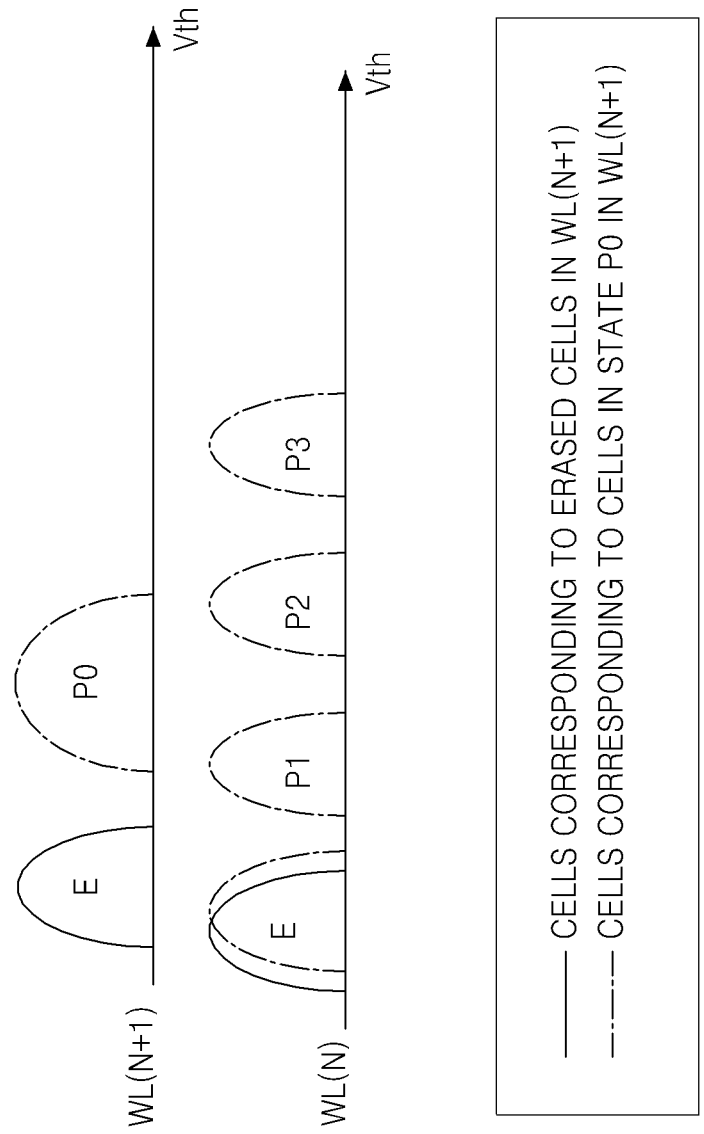

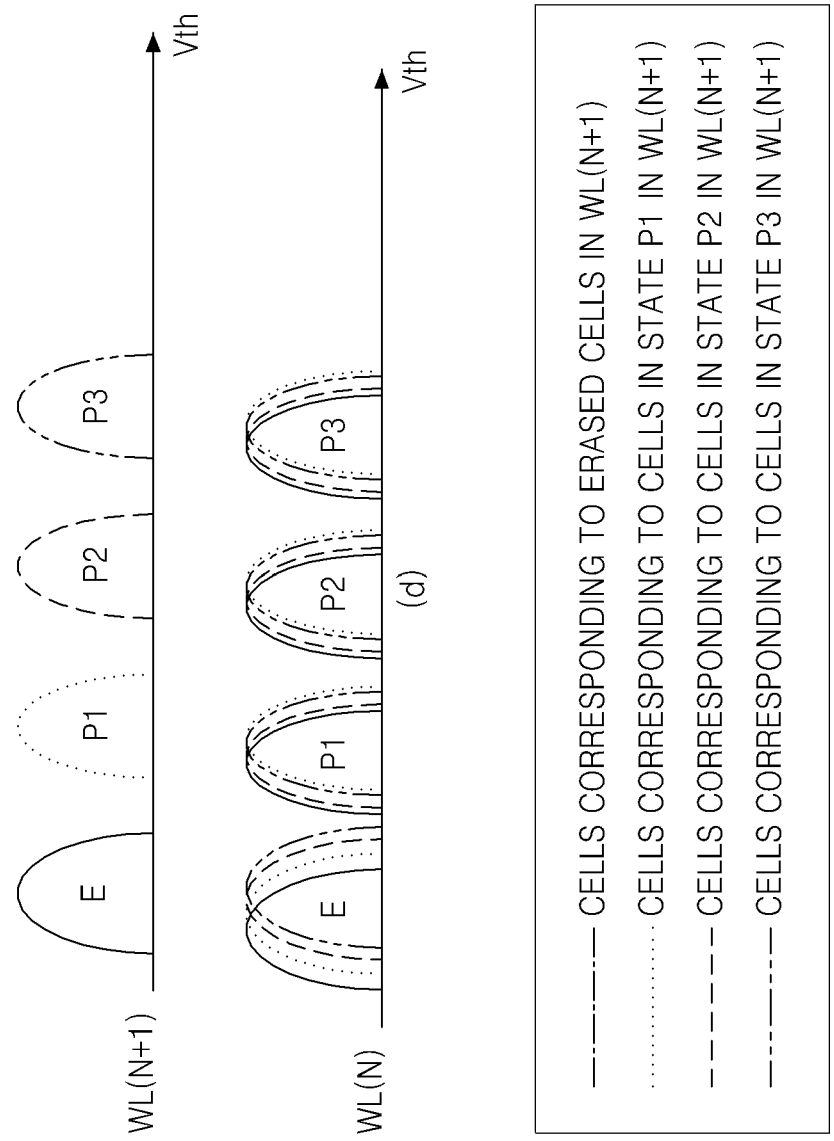

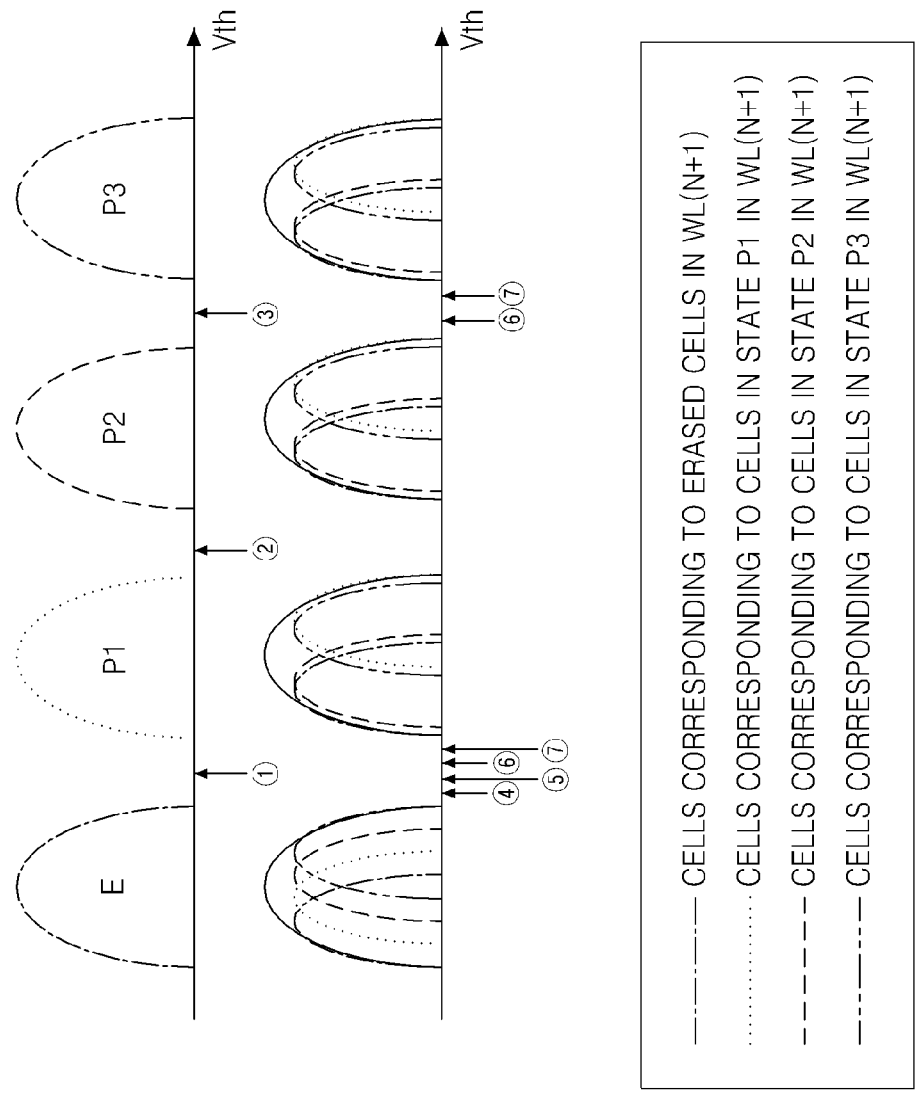

FIG. 16

| Word Line | MSB / LSB Page | All Bit Line |
|---|---|---|
| WL3 | MSB | 7 Page |
|  | LSB | 5 Page |
| WL2 | MSB | 6 Page |
|  | LSB | 3 Page |
| WL1 | MSB | 4 Page |
|  | LSB | 1 Page |
| WL0 | MSB | 2 Page |
|  | LSB | 0 Page |

FIG. 17

| Word Line | MSB / LSB Page | Even Bit Line | Odd Bit Line |
|---|---|---|---|
| WL3 | MSB | 14 Page | 15 Page |
| | LSB | 10 Page | 11 Page |
| WL2 | MSB | 12 Page | 13 Page |
| | LSB | 6 Page | 7 Page |
| WL1 | MSB | 8 Page | 9 Page |
| | LSB | 2 Page | 3 Page |
| WL0 | MSB | 4 Page | 5 Page |
| | LSB | 0 Page | 1 Page |

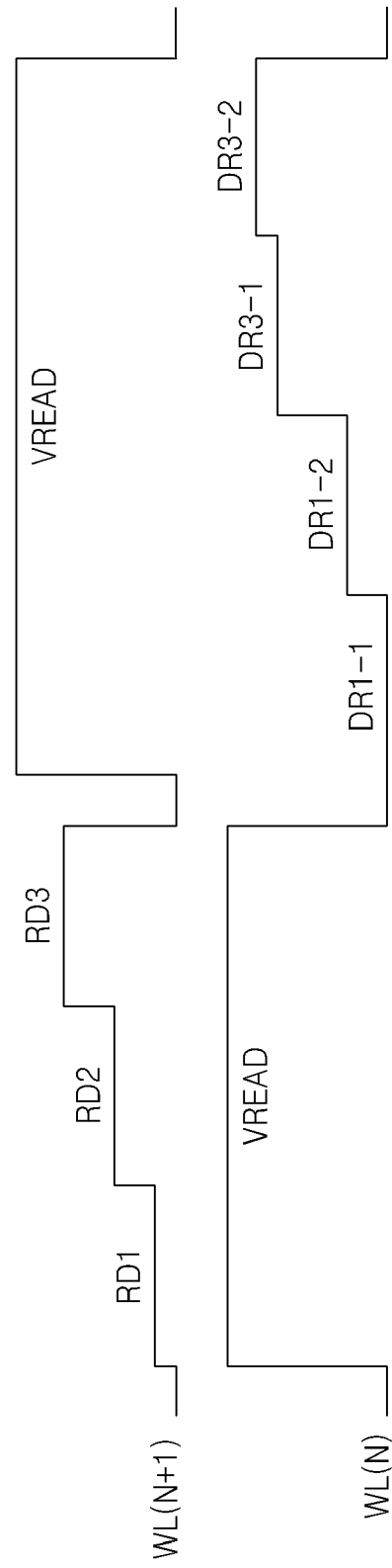

| ① WL(n+1) Read @ R1/R2/R3 | | | | | |
|---|---|---|---|---|---|
| n+1 | n | S | M | L | F |
| E, P2 | E | 1 | 1 | 1 | – |
| P1, P3 | E | 0 | 0 | 1 | – |
| E, P2 | P1 | 1 | 1 | 1 | – |
| P1, P3 | P1 | 0 | 0 | 1 | – |
| E, P2 | P2 | 1 | 1 | 1 | – |
| P1, P3 | P2 | 0 | 0 | 1 | – |
| E, P2 | P3 | 1 | 1 | 1 | – |
| P1, P3 | P3 | 0 | 0 | 1 | – |

FIG. 20E

| ⑤ WL(n) Read @ DR3-2 | | | | | |
|---|---|---|---|---|---|
| n+1 | n | S | M | L | F |
| E, P2 | E | 1 | 1 | 1 | – |
| P1, P3 | E | 1 | 0 | 1 | – |
| E, P2 | P1 | 1 | 1 | 0 | – |
| P1, P3 | P1 | 1 | 0 | 0 | – |
| E, P2 | P2 | 1 | 1 | 0 | – |
| P1, P3 | P2 | 1 | 0 | 0 | – |
| E, P2 | P3 | 1/0 | 1 | 1 | – |
| P1, P3 | P3 | 0 | 0 | 1 | – |

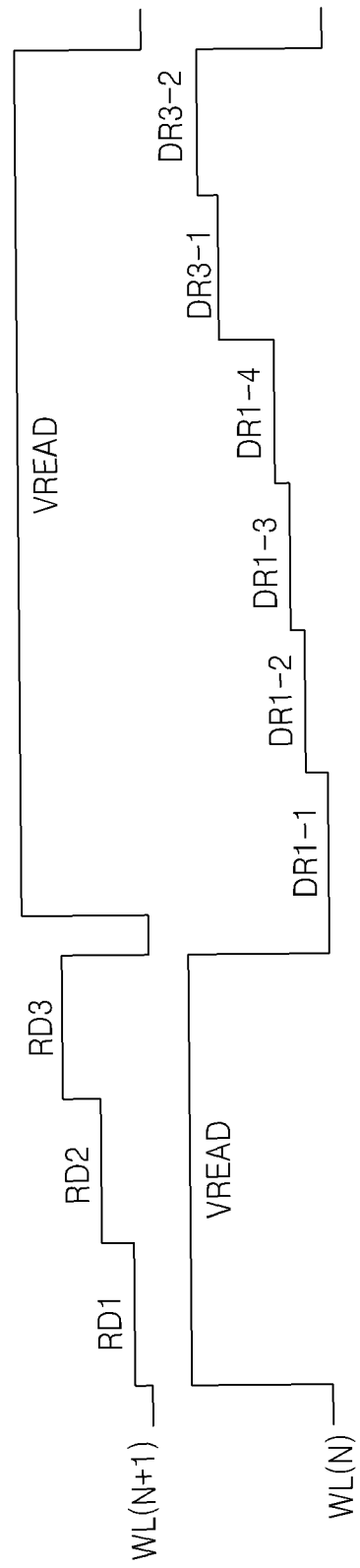

FIG. 22A

| n+1 | n | S | M | L | F |
|---|---|---|---|---|---|
| ① WL(n+1) Read @ R1/R2/R3 ||||||
| E | E | 1 | 1 | 1 | 1 |
| P1 | E | 0 | 0 | 1 | 1 |
| P2 | E | 1 | 1 | 1 | 0 |
| P3 | E | 0 | 0 | 1 | 0 |
| E | P1 | 1 | 1 | 1 | 1 |
| P1 | P1 | 0 | 0 | 1 | 1 |
| P2 | P1 | 1 | 1 | 1 | 0 |
| P3 | P1 | 0 | 0 | 1 | 0 |
| E | P2 | 1 | 1 | 1 | 1 |
| P1 | P2 | 0 | 0 | 1 | 1 |
| P2 | P2 | 1 | 1 | 1 | 0 |
| P3 | P2 | 0 | 0 | 1 | 0 |
| E | P3 | 1 | 1 | 1 | 1 |
| P1 | P3 | 0 | 0 | 1 | 1 |
| P2 | P3 | 1 | 1 | 1 | 0 |
| P3 | P3 | 0 | 0 | 1 | 0 |

FIG. 22B

| ② WL(n) Read @ DR1-1 | | | | | |
|---|---|---|---|---|---|
| n+1 | n | S | M | L | F |
| E | E | 1 | 1 | 1 | 1 |
| P1 | E | 1/0 | 0 | 1 | 1 |
| P2 | E | 1/0 | 1 | 1 | 0 |
| P3 | E | 1/0 | 0 | 1 | 0 |
| E | P1 | 0 | 1 | 0 | 1 |
| P1 | P1 | 0 | 0 | 1 | 1 |
| P2 | P1 | 0 | 1 | 1 | 0 |
| P3 | P1 | 0 | 0 | 1 | 0 |
| E | P2 | 0 | 1 | 0 | 1 |
| P1 | P2 | 0 | 0 | 1 | 1 |
| P2 | P2 | 0 | 1 | 1 | 0 |
| P3 | P2 | 0 | 0 | 1 | 0 |
| E | P3 | 0 | 1 | 0 | 1 |
| P1 | P3 | 0 | 0 | 1 | 1 |
| P2 | P3 | 0 | 1 | 1 | 0 |
| P3 | P3 | 0 | 0 | 1 | 0 |

FIG. 22C

| ③ WL(n) Read @ DR1-2 | | | | | |
|---|---|---|---|---|---|
| n+1 | n | S | M | L | F |
| E | E | 1 | 1 | 1 | 1 |
| P1 | E | 1 | 0 | 1 | 1 |
| P2 | E | 1/0 | 1 | 1 | 0 |
| P3 | E | 1/0 | 0 | 1 | 0 |
| E | P1 | 1/0 | 1 | 0 | 1 |
| P1 | P1 | 0 | 0 | 0 | 1 |
| P2 | P1 | 0 | 1 | 1 | 0 |
| P3 | P1 | 0 | 0 | 1 | 0 |
| E | P2 | 0 | 1 | 0 | 1 |
| P1 | P2 | 0 | 0 | 0 | 1 |
| P2 | P2 | 0 | 1 | 1 | 0 |
| P3 | P2 | 0 | 0 | 1 | 0 |
| E | P3 | 0 | 1 | 0 | 1 |
| P1 | P3 | 0 | 0 | 0 | 1 |
| P2 | P3 | 0 | 1 | 1 | 0 |
| P3 | P3 | 0 | 0 | 1 | 0 |

FIG. 22D

| ④ WL(n) Read @ DR1-3 | | | | | |
|---|---|---|---|---|---|
| n+1 | n | S | M | L | F |
| E | E | 1 | 1 | 1 | 1 |
| P1 | E | 1 | 0 | 1 | 1 |
| P2 | E | 1 | 1 | 1 | 0 |
| P3 | E | 1/0 | 0 | 1 | 0 |
| E | P1 | 1/0 | 1 | 0 | 1 |
| P1 | P1 | 1/0 | 0 | 0 | 1 |
| P2 | P1 | 0 | 1 | 0 | 0 |
| P3 | P1 | 0 | 0 | 1 | 0 |
| E | P2 | 0 | 1 | 0 | 1 |
| P1 | P2 | 0 | 0 | 0 | 1 |
| P2 | P2 | 0 | 1 | 0 | 0 |
| P3 | P2 | 0 | 0 | 1 | 0 |
| E | P3 | 0 | 1 | 0 | 1 |
| P1 | P3 | 0 | 0 | 0 | 1 |
| P2 | P3 | 0 | 1 | 0 | 0 |
| P3 | P3 | 0 | 0 | 1 | 0 |

FIG. 22E

| n+1 | n | S | M | L | F |
|-----|----|-----|---|---|---|
| \(⑤\) WL(n) Read @ DR1-4 ||||||
| E | E | 1 | 1 | 1 | 1 |
| P1 | E | 1 | 0 | 1 | 1 |
| P2 | E | 1 | 1 | 1 | 0 |
| P3 | E | 1 | 0 | 1 | 0 |
| E | P1 | 1/0 | 1 | 0 | 1 |
| P1 | P1 | 1/0 | 0 | 0 | 1 |
| P2 | P1 | 1/0 | 1 | 0 | 0 |
| P3 | P1 | 0 | 0 | 0 | 0 |
| E | P2 | 0 | 1 | 0 | 1 |
| P1 | P2 | 0 | 0 | 0 | 1 |
| P2 | P2 | 0 | 1 | 0 | 0 |
| P3 | P2 | 0 | 0 | 0 | 0 |
| E | P3 | 0 | 1 | 0 | 1 |
| P1 | P3 | 0 | 0 | 0 | 1 |
| P2 | P3 | 0 | 1 | 0 | 0 |
| P3 | P3 | 0 | 0 | 0 | 0 |

FIG. 22F

| n+1 | n | S | M | L | F |
|---|---|---|---|---|---|
| ⑥ WL(n) Read @ DR3-1 ||||||
| E  | E  | 1   | 1 | 1 | 1 |
| P1 | E  | 1   | 0 | 1 | 1 |
| P2 | E  | 1   | 1 | 1 | 0 |
| P3 | E  | 1   | 0 | 1 | 0 |
| E  | P1 | 1   | 1 | 0 | 1 |
| P1 | P1 | 1   | 0 | 0 | 1 |
| P2 | P1 | 1   | 1 | 0 | 0 |
| P3 | P1 | 1   | 0 | 0 | 0 |
| E  | P2 | 1   | 1 | 0 | 1 |
| P1 | P2 | 1/0 | 0 | 0 | 1 |
| P2 | P2 | 1   | 1 | 0 | 0 |
| P3 | P2 | 1/0 | 0 | 0 | 0 |
| E  | P3 | 0   | 1 | 1 | 1 |
| P1 | P3 | 0   | 0 | 0 | 1 |
| P2 | P3 | 0   | 1 | 1 | 0 |
| P3 | P3 | 0   | 0 | 0 | 0 |

FIG. 22G

| ⑦ WL(n) Read @ DR3-2 | | | | | |
|---|---|---|---|---|---|
| n+1 | n | S | M | L | F |
| E | E | 1 | 1 | 1 | 1 |
| P1 | E | 1 | 0 | 1 | 1 |
| P2 | E | 1 | 1 | 1 | 0 |
| P3 | E | 1 | 0 | 1 | 0 |
| E | P1 | 1 | 1 | 0 | 1 |
| P1 | P1 | 1 | 0 | 0 | 1 |
| P2 | P1 | 1 | 1 | 0 | 0 |
| P3 | P1 | 1 | 0 | 0 | 0 |
| E | P2 | 1 | 1 | 0 | 1 |
| P1 | P2 | 1 | 0 | 0 | 1 |
| P2 | P2 | 1 | 1 | 0 | 0 |
| P3 | P2 | 1/0 | 0 | 0 | 0 |
| E | P3 | 1 | 1 | 1 | 1 |
| P1 | P3 | 1/0 | 0 | 1 | 1 |
| P2 | P3 | 0 | 1 | 1 | 0 |
| P3 | P3 | 0 | 0 | 1 | 0 |

NON-VOLATILE MULTI-LEVEL MEMORY DEVICE AND DATA READ METHOD

CROSS-REFERENCE TO RELATED APPLICATIONS

This application claims priority under 35 U.S.C. §119(a) from Korean Patent Application No. 10-2011-0092243 filed on Sep. 9, 2011, the subject matter of which is hereby incorporated by reference.

BACKGROUND

Embodiments of the inventive concept relate to non-volatile memory devices, and more particularly, to non-volatile multi-level (NVML) memory devices capable of reducing read errors caused by coupling effects between proximate memory cells in a constituent memory cell array. Embodiments of the inventive concept also relate to read methods used to read the state of NVML memory cells in such NVML memory devices.

Multi-level memory cells are respectively capable of storing two or more bits in a single memory cell. This ability enables significant improvements in the data storage density per unit area of memory cell arrays. With the demand on high-capacity NAND flash memory products, the number of bits capable of being stored in a NVML memory cell (hereinafter, referred to as a "cell") has increased. Information in the form of digital data values is stored in each cell according to different threshold voltages states. Thus, programming operations are used to define a particular state to "write" a data value to the cell, while read operations are used to determine the state of the cell to "read" the data value of the cell. As the number of bits stored in a cell increases, the degree of cell integration also increases and various types of interference occur. Coupling effects between adjacent (or proximate) cells in a memory cell array are one type of interference.

Inter-cell coupling usually includes bit-line coupling along a column direction and word-line coupling in a row direction. Inter-cell coupling of any type can cause read errors. Erased cells (memory cells intended to be in the erase state) are relatively more affected by the word-line coupling than programmed cells (memory cells intended to be in one of a plurality of programmed states). Accordingly, a read error is more likely to occur during a read operation using a read voltage to distinguish (or discriminate) between an erased cell and a programmed cell.

SUMMARY

According to certain embodiments of the inventive concept, there is provided a method reading data from a plurality of non-volatile multi-level memory cells respectively connected between a plurality of word lines and a plurality of bit lines in a memory cell array, each one of the memory cells capable of being programmed to one of a plurality of states including at least an erase state, a first programmed state, a second programmed state, and a third programmed state, the method comprising; receiving a read command directed to a first memory cell connected to a first word line (WL), in response to the read command, reading a state of a second memory cell connected to a second WL adjacent to the first WL, and thereafter, reading a state of the first memory cell using a read voltage that varies with the state of the second memory cell, wherein the read voltage varies among a first number of read voltages when used to distinguish between the erased state and the first programmed state, and the read voltage varies among a second number of read voltages less than the first number when used to distinguish between the second programmed state and the third programmed state.

According to certain embodiments of the inventive concept, there is provided a method of operating a non-volatile memory device including first through N-th word lines, a plurality of bit lines and non-volatile multi-level memory cells respectively connected between the first through N-th word lines and the bit lines, where N is an integer greater than or equal to 2, the method comprising; receiving a read command directed to a first memory cell connected to an M-th word line (WL), where M is an integer ranging from 1 to N−1, in response to the read command, reading data from at least one of a second memory cell connected to a (M−1)-th WL adjacent on one side to the M-th WL and a third memory cell connected to a (M+1)-th WL adjacent on another side to the M-th WL, selecting at least one of a first group of read voltages and a second group of read voltages from among a plurality of predetermined groups of read voltages in response to the data read from the at least one of the second memory cell and the third memory cell, and distinguishing between an erased state and a first programmed state for the first memory cell using a first read voltage selected from the first group of read voltages, and distinguishing between a second programmed state and a third programmed state for the first memory cell using a second read voltage selected from the second group of read voltages, wherein a number of read voltages in the first group of read voltages is greater than a number of read voltages in the second group of read voltages.

According to certain embodiments of the inventive concept, there is provided a non-volatile memory device comprising; a memory cell array comprising a string selection line, a ground selection line, first through N-th word lines disposed between the ground selection line and the string selection line, a plurality of bit lines and non-volatile multi-level memory cells connected between the first through N-th word lines and the bit lines, where N is an integer greater than 2, and an access circuit configured to read data from a second memory cell connected to word line (WL) adjacent to an N-th WL in response to a read command directed to a first memory cell connected to the N-th WL, wherein the first memory cell is capable of being programmed to an erase state, a first programmed state, a second programmed state, and a third programmed state, and the access circuit is further configured in response to a data read from the second memory cell to select a first read voltage selected from a first group of read voltages when discriminating between the erase state and the first programmed state and select a second read voltage selected from a second group of read voltages when discriminating between the second programmed state and the third programmed state, wherein a number of read voltages in the first group of read voltages is greater than the second group of read voltages.

According to certain embodiments of the inventive concept, there is provided a memory system comprising; a non-volatile memory device, and a memory controller configured to control the non-volatile memory device. The non-volatile memory device comprises; a memory cell array comprising a string selection line, a ground selection line, first through N-th word lines disposed between the ground selection line and the string selection line, a plurality of bit lines and non-volatile multi-level memory cells connected between the first through N-th word lines and the bit lines, where N is an integer greater than 2, and an access circuit configured to read data from a second memory cell connected to word line (WL) adjacent to an N-th WL in response to a read command directed to a first memory cell connected to the N-th WL, wherein the first memory cell is capable of being programmed to an erase state, a first programmed state, a second programmed state, and a third programmed state, and the access circuit is further configured in response to a data read from the second memory cell to select a first read voltage selected from a first group of read voltages when discriminating between the erase state and the first programmed state and select a second read voltage selected from a second group of read voltages when discriminating between the second programmed state and the third programmed state, wherein a number of read voltages in the first group of read voltages is greater than the second group of read voltages.

According to certain embodiments of the inventive concept, there is provided a method of reading data from a plurality of non-volatile multi-level memory cells respectively connected between a plurality of word lines and a plurality of bit lines in a memory cell array, the method comprising: receiving a read command directed to a first memory cell connected to a first word line (WL) in the memory cell array, determining whether a second memory cell connected to a second WL adjacent to the first WL has been programmed, when it is determined that the second memory cell has been programmed, performing a data recover read operation by reading data from the second memory cell and then reading data from the first memory cell using a read voltage having a level that varies with a state of the second memory cell, and when it is determined that the second memory cell has not been programmed, performing a normal read operation on the first memory cell.

In other embodiments, a method of reading data from a plurality of non-volatile multi-level memory cells connected between a plurality of word lines and a plurality of bit lines includes reading data from a first bit line in a memory cell array and storing the data and reading data from a second bit line using a different voltage according to a state of the data read from the first bit line.

BRIEF DESCRIPTION OF THE DRAWINGS

The above and other features and advantages of the inventive concept will become more apparent upon consideration of certain exemplary embodiments of the inventive concept with reference to the attached drawings in which:

FIG. 7 is a diagram describing an example of a data read operation of a typical non-volatile memory device;

FIGS. 8A and 8B are diagrams describing another example of the data read operation of the typical non-volatile memory device;

FIGS. 14A through 14D are diagrams showing the distribution after the first and second pages of the N-th word line and the (N+1)-th word line are programmed in order according to certain embodiments of the inventive concept;

FIG. 15 is a diagram describing a method of reading the second page according to certain embodiments of the inventive concept;

FIGS. 16 and 17 are diagrams describing program order in a NAND flash memory device with respect to word lines;

FIG. 19 is a diagram showing voltages applied to word lines in a data read operation according to certain embodiments of the inventive concept;

FIGS. 20A through 20E are tables showing values stored in a buffer in a data read operation according to certain embodiments of the inventive concept;

FIG. 21 is a diagram showing voltages applied to word lines in a data read operation according to other embodiments of the inventive concept;

FIGS. 22A through 22G are tables showing values stored in a buffer in a data read operation according to other embodiments of the inventive concept;

DETAILED DESCRIPTION

The inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements and/or features.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
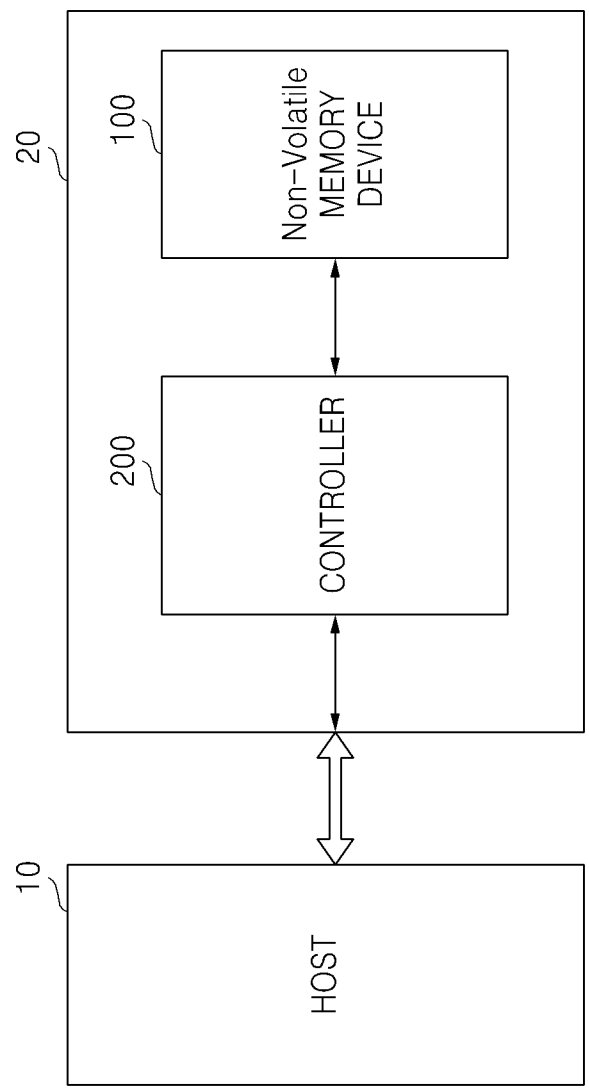
FIG. 1 is a schematic block diagram of a non-volatile memory system according to certain embodiments of the inventive concept.

FIG. 1 is a schematic block diagram of a non-volatile memory system 20 according to certain embodiments of the inventive concept. The non-volatile memory system 20 connected with a host 10 includes a memory controller 200 and a non-volatile memory device 100. The non-volatile memory system 20 is any system that includes non-volatile memory.

The memory controller 200 generates an address and a command (e.g., a program command, a read command or an erase command) for controlling an operation (e.g., a program operation, a read operation or an erase operation) of the non-volatile memory device (e.g., a flash memory device) 100. The program operation and the read operation are performed in units of pages and the erase operation is performed in units of blocks.

The memory controller 200 outputs a command for controlling the operation of the non-volatile memory device 100 to the non-volatile memory device 100.

The non-volatile memory device 100 performs the operation in response to the command and sends an operation result to the memory controller 200. The non-volatile memory device 100 and the memory controller 200 are connected with each other through a bus. The command, data, a state signal and so on are transmitted through the bus.

The memory controller 200 and the non-volatile memory device 100 may be packaged in separate packages, respectively, or may be packaged in a single package.

Figure 2:
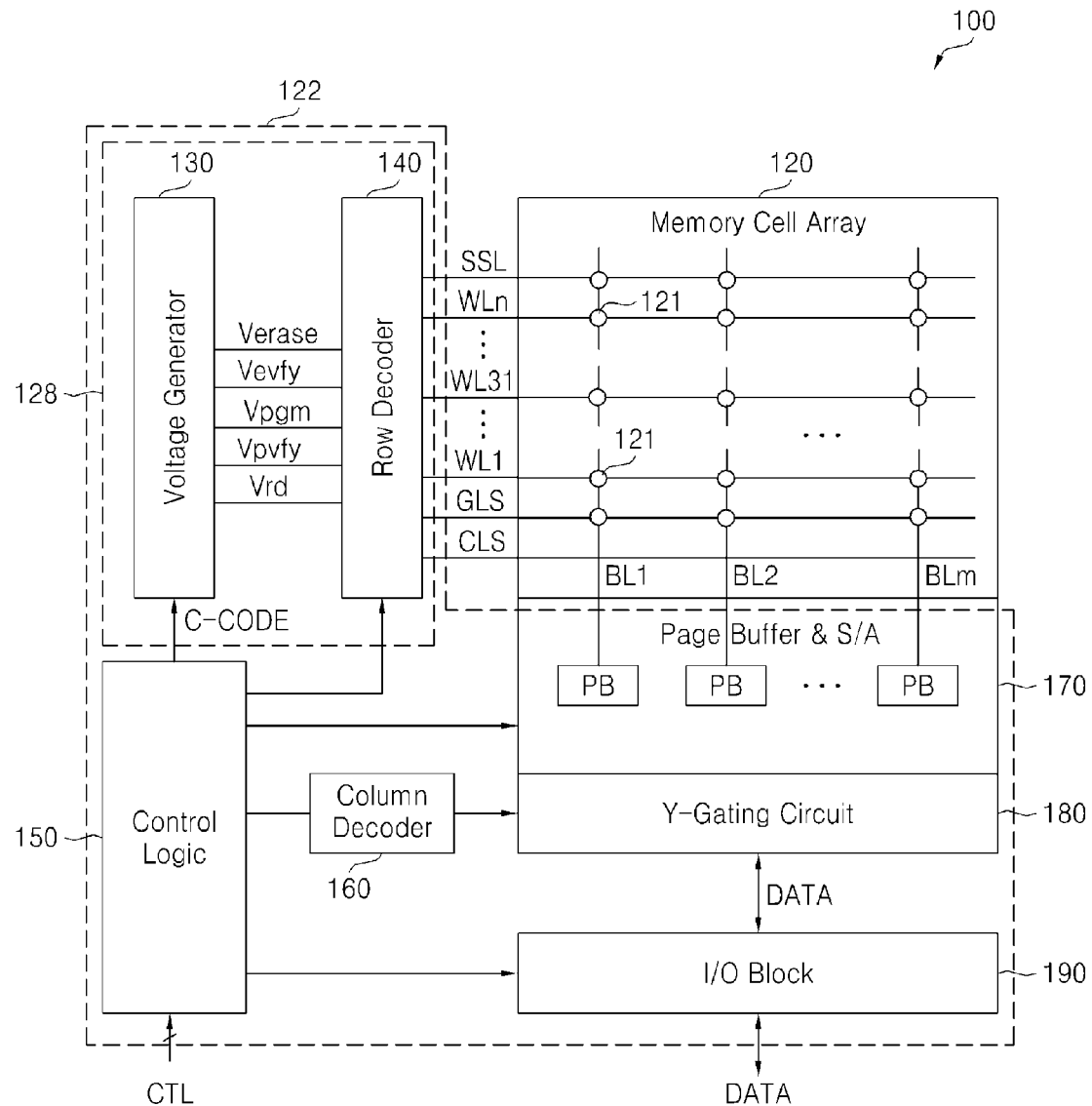
FIG. 2 is a detailed block diagram of a non-volatile memory device illustrated in FIG. 1.

FIG. 2 is a detailed block diagram of the non-volatile memory device 100 illustrated in FIG. 1. Referring to FIG. 2, the non-volatile memory device 100 includes a memory cell array 120 and an access circuit 122.

As described above, the non-volatile memory device 100 performs the program operation and the read operation in units of pages and performs the erase operation in units of memory blocks. A memory block is a group of a plurality of pages.

The controller 200 and the non-volatile memory device 100 are connected with each other through a plurality of channels. A plurality of flash memory elements are connected to each of the channels.

Figure 3:
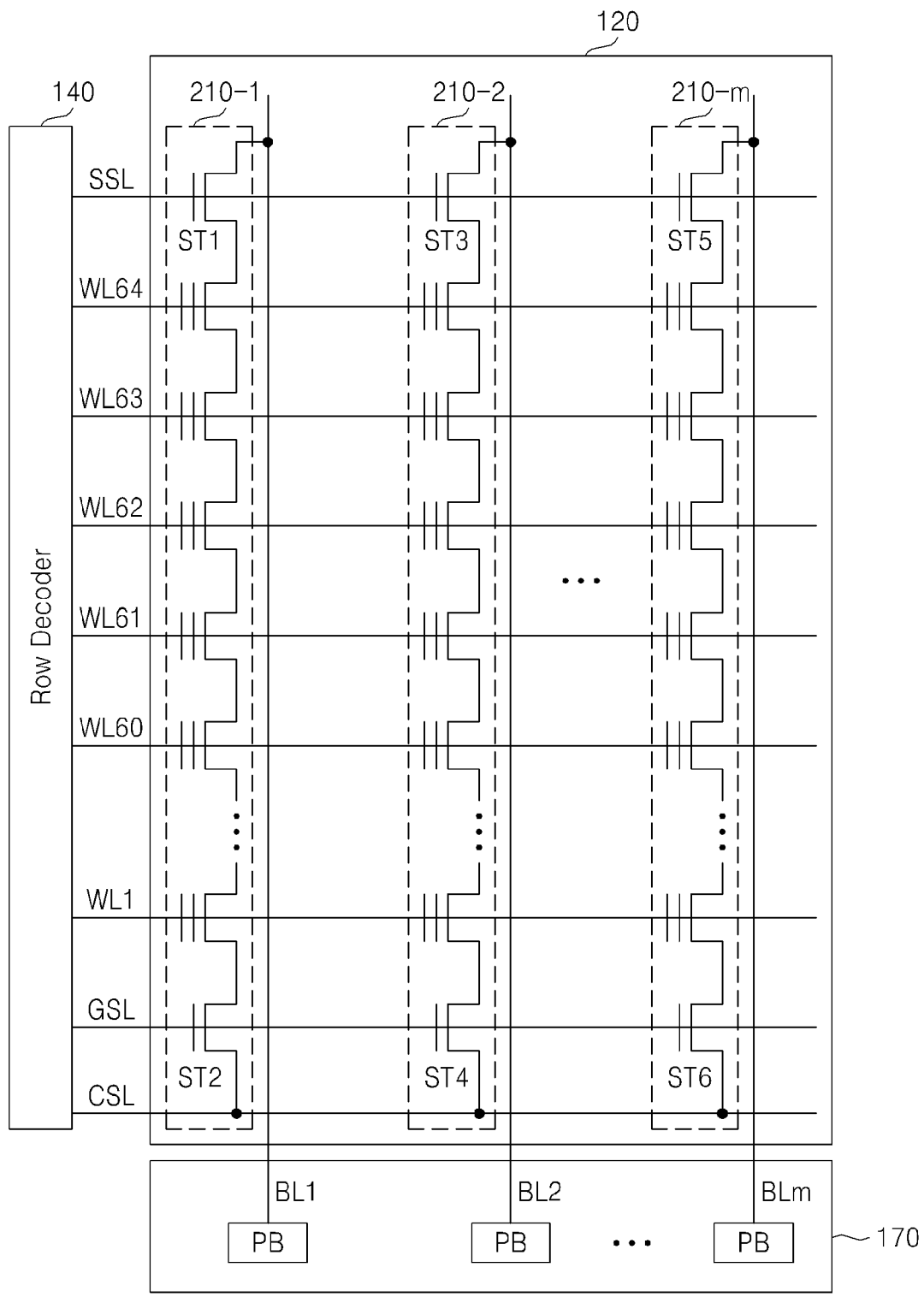
FIG. 3 is a diagram of a memory cell array of the non-volatile memory device illustrated in FIG. 2, which is implemented in two dimensions.

The memory cell array 120 includes NAND memory cell strings respectively connected to bit lines BL1 through BLm. Each of the NAND memory cell strings includes a plurality of non-volatile memory cells 121 connected in series to one another. Each NAND memory cell string may be laid out (or embodied) on one plane (or layer) in two dimensions as illustrated in FIG. 3.

Figure 4:
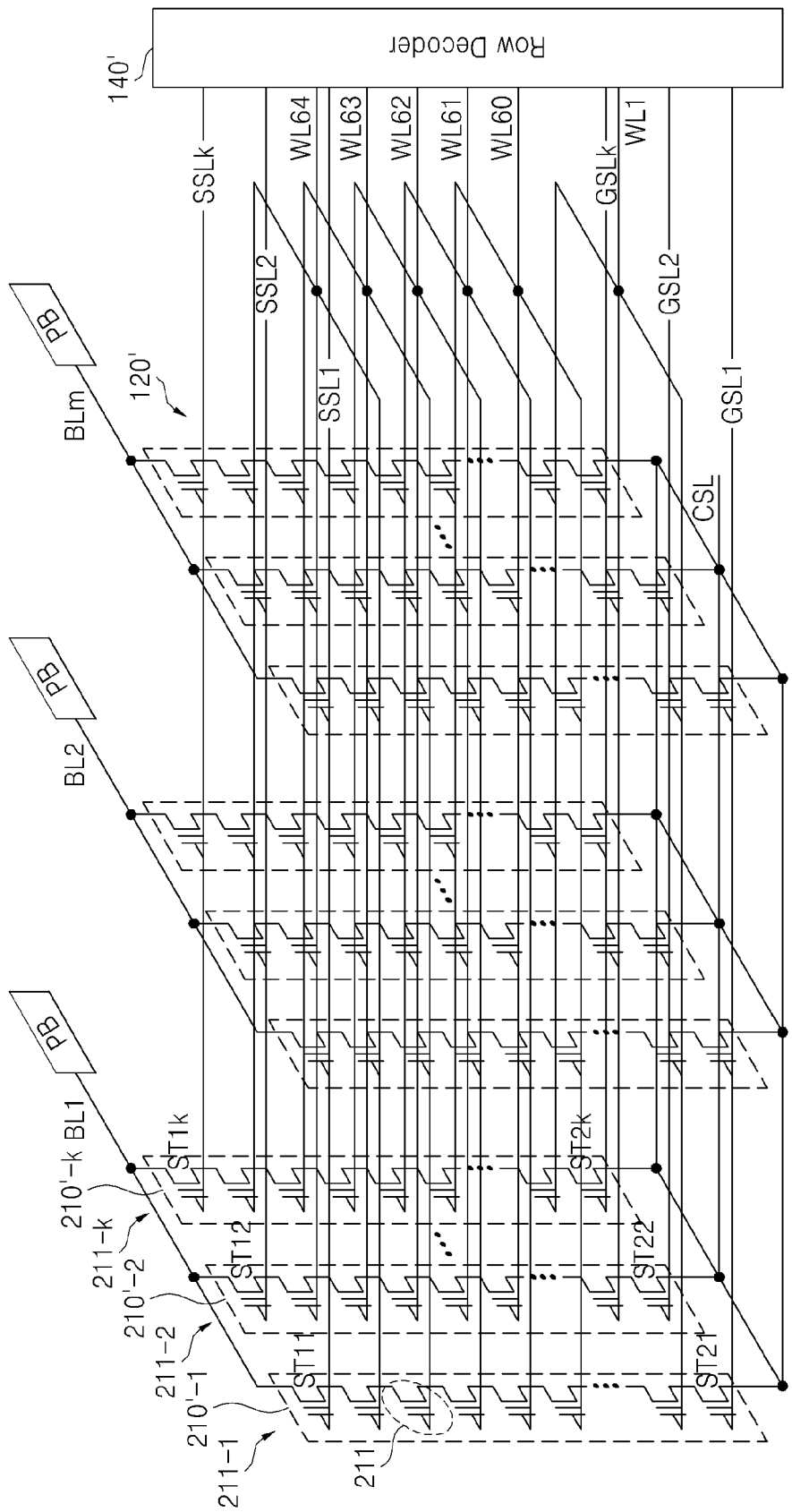
FIG. 4 is a diagram of the memory cell array of the non-volatile memory device illustrated in FIG. 2, which is implemented in three dimensions.

Alternatively, the memory cell array 120 may be implemented in three dimensions, as illustrated in FIG. 4, using a wafer stack, a chip stack or a cell stack.

The NAND memory cell string includes the non-volatile memory cells 121 connected in series between a string selection transistor connected to one of the bit lines BL1 through BLm and a ground selection transistor connected to a common source line CSL.

A gate of the string selection transistor is connected to a string selection line SSL. Gates of the respective non-volatile memory cells 121 are connected to a plurality of word lines WL1 through WLn, respectively. A gate of the ground selection transistor is connected to a ground selection line GSL. The number of word lines WL1 through WLn may vary with different embodiments.

The non-volatile memory cells 121 included in the NAND memory cell strings may be implemented using flash electrically erasable programmable read-only memory (EEPROM) which can store one or more bits.

Accordingly, each of the non-volatile memory cells 121 may be embodied by a NAND flash memory cell storing at least one bit, e.g., a single level (SL) cell (or SLC) or a multi-level (ML) cell (or MLC).

The access circuit 122 accesses the memory cell array 120 to perform a data access operation such as the program operation, the read operation or the erase operation, according to a command (or command sets) and an address received from an outside, e.g., the memory controller 200.

The access circuit 122 includes a voltage generator 130, a row decoder 140, a control logic 150, a column decoder 160, a page buffer and sense amplifier (S/A) block 170, a Y-gating circuit 180 and an input/output (I/O) block 190.

The voltage generator 130 may generate voltages necessary for data access operations in response to control codes generated by the control logic 150.

In response to the control codes, the voltage generator 130 generate a program voltage Vpgm and a program-verify voltage Vpvfy necessary to perform the program operation, a plurality of read voltages Vrd necessary to perform the read operation and an erase voltage Verase and an erase-verify voltage Vevfy necessary to perform the erase operation and output the voltages necessary for each of the operations to the row decoder 140.

The control logic 150 controls the overall operation of the access circuit 122 in response to a control signal CTL output from the memory controller 200. The control logic 150 may control memory read state information to be sensed and data that has been read to be output to the memory controller 200 during a memory read operation.

The control logic 150 may also check data read from data stored in data registers for errors in response to a command output from the memory controller 200, output the errors to the memory controller 200 if the errors exist, so that the error-corrected data is sent to the host 10.

Under the control of the control logic 150, the column decoder 160 decodes a column address and outputs a plurality of select signals to the Y-gating circuit 180.

The page buffer and S/A block 170 includes a plurality of page buffers PB. The page buffers PB are respectively connected with the bit lines BL1 through BLm.

The page buffers PB may operate as drivers that temporarily store data read from the memory cell array 120 in the read operation according to the control of the control logic 150. When storing the data temporarily, each of the page buffers PB may be implemented by an at least two-step buffer or latch. For instance, each page buffer PB may include four latches (hereinafter, referred to as S, M, L and F latches, respectively). This will be described in detail with reference to FIGS. 21 through 24 later. Each of the page buffers PB may also operate as an S/A which senses and amplifies a voltage of each bit line during the read operation according to the control of the control logic 150.

The Y-gating circuit 180 may control transmission of data between the page buffer and S/A block 170 and the I/O block 190 in response to the select signals received from the column decoder 160.

The I/O block 190 may transmit data from an outside to the Y-gating circuit 180 or transmit data from the Y-gating circuit 180 to the memory controller 200 through a plurality of I/O pins (or a data bus).

FIG. 3 is a diagram of the memory cell array 120 of the non-volatile memory device 100 illustrated in FIG. 2, which is implemented in two dimensions.

Referring to FIG. 3, the memory cell array 120 includes a plurality of NAND memory cell strings 210-1, 210-2, . . . , 210-$m$ where "m" is a natural number. Each of the NAND memory cell strings 210-1 through 210-$m$ includes a plurality of nonvolatile memory cells connected in series.

The NAND memory cell strings 210-1 through 210-$m$ may be laid out or embodied on one plane or layer in two dimensions.

The NAND memory cell string 210-1 includes a plurality of non-volatile memory cells connected in series between a first selection transistor (or a string selection transistor) ST1 connected to the bit line BL1 and a second selection transistor (or a ground selection transistor) ST2 connected to the common source line CSL.

A gate of the first selection transistor ST1 is connected to the string selection line SSL. Gates of the respective non-volatile memory cells are connected to a plurality of word lines WL1 through W64, respectively. A gate of the second selection transistor ST2 is connected to the ground selection line GSL.

The structure of the NAND memory cell strings 210-2 through 210-$m$ is substantially the same as that of the NAND memory cell string 210-1.

Although the 64 word lines WL1 through WL64 are illustrated in FIG. 3 and FIG. 4 for clarity of the description, the ideas of the inventive concept is not restricted by the number of word lines. The number of word lines "n" may be 2 or an integer greater than 2.

Although not shown, at least one dummy word line may be provided.

The non-volatile memory cells included in the NAND memory cell strings 210-1 through 210-$m$ may be implemented using flash EEPROM which can store one or more bits.

Accordingly, each of the non-volatile memory cells may be embodied by a NAND flash memory cell storing at least one bit, e.g., an SLC or an MLC.

FIG. 4 is a diagram of the memory cell array 120 of the non-volatile memory device 100 illustrated in FIG. 2, which is implemented in three dimensions.

Referring to FIG. 4, NAND memory cell strings 210'-1, 210'-2, . . . , 210'-$k$ (where "k" is a natural number) may be laid out on different planes in three dimensions. At this time, an access circuit which can access each of the NAND memory cell strings 210'-1 through 210'-$k$ may be shared by the NAND memory cell strings 210'-1 through 210'-$k$.

The first NAND memory cell string 210'-1 may be laid out on a first layer 211-1, the second NAND memory cell string 210'-2 may be laid out on a second layer 211-2 different from the first layer 211-1, and the k-th NAND memory cell string 210'-$k$ may be laid out on a k-th layer 211-$k$ different from the second layer 211-2.

The layers 211-1 through 211-$k$ may be formed in a wafer stack, a chip stack, or a cell stack. The layers 211-1 through 211-$k$ may be connected with one another using a through-silicon via (TSV), a bump or wire bonding. Each of the layers 211-1 through 211-$k$ includes a plurality of cell strings.

The first NAND memory cell string 210'-1 on the first layer 211-1 includes a plurality of non-volatile memory cells, e.g., NAND flash memory cells, connected in series between a plurality of selection transistors ST11 and ST21.

The second NAND memory cell string 210'-2 on the second layer 211-2 includes a plurality of non-volatile memory cells, e.g., NAND flash memory cells, connected in series between a plurality of selection transistors ST12 and ST22.

The k-th NAND memory cell string 210'-$k$ on the k-th layer 211-$k$ includes a plurality of non-volatile memory cells, e.g., NAND flash memory cells, connected in series between a plurality of selection transistors ST1$k$ and ST2$k$.

As illustrated in FIG. 4, the NAND memory cell strings 210'-1 through 210'-$k$ may share the word lines WL1 through WL64, the common source line CSL and the bit line BL1 with one another. In other words, the NAND memory cell strings implemented at corresponding positions in the respective layers 211-1 through 211-$k$ may be connected to one of the page buffers PB included in the page buffer and S/A block 170.

The memory cell array 120 generally includes the two-dimensional memory cell array 120 illustrated in FIG. 3 and the three-dimensional memory cell array 120' illustrated in FIG. 4 in the embodiments of the inventive concept.

Figure 5:
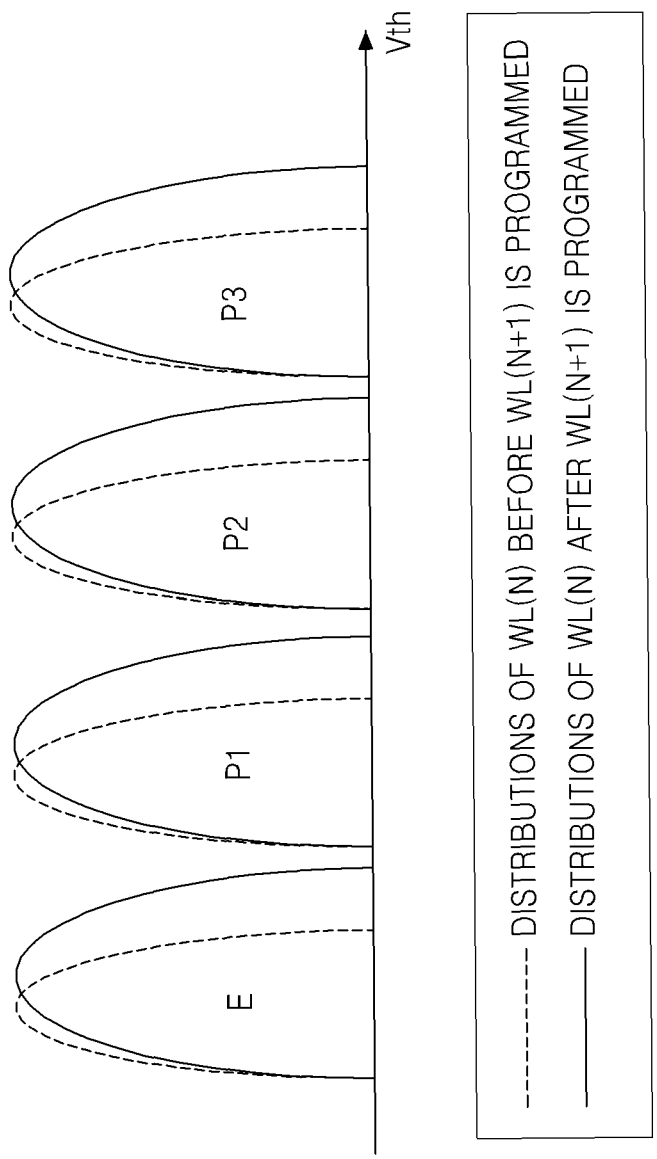
FIG. 5 is a diagram describing word-line coupling in a non-volatile memory device.

FIG. 5 is a diagram conceptually describing word-line coupling in a non-volatile memory device. The word-line coupling is a phenomenon in which when a word line WL(N−1) or WL(N+1) adjacent to an N-th word line WL(N) is programmed after the N-th word line WL(N) is programmed, a threshold voltage Vth of the N-th word line WL(N) changes as a threshold voltage Vth of the adjacent word line WL(N−1) or WL(N+1) changes, and therefore, cell distributions become broader.

FIG. 5 shows cell distributions of the N-th word line WL(N) before and after the (N+1)-th word line WL(N+1) is programmed in an MLC non-volatile memory device. As illustrated in FIG. 5, the cell distributions of the N-th word line WL(N) after the (N+1)-th word line WL(N+1) is programmed are broader than the cell distribution of the N-th word line WL(N) before the (N+1)-th word line WL(N+1) is programmed. This is, as described above, because the threshold voltage Vth of the N-th word line WL(N) shifts to the right due to coupling when the (N+1)-th word line WL(N+1) is programmed. At this time, the threshold voltages Vth of all cells in the N-th word line WL(N) do not change but the threshold voltages Vth of only cells in the upper part of the distributions change because cells affected by the coupling and cells not affected by the coupling coexist as the (N+1)-th word line WL(N+1) is programmed. As a result, the cell distributions do not entirely shift but become broader.

When the cell distributions change due to word-line coupling as described above, a margin between states decreases, and therefore, the probability of read errors increases. To improve the read errors due to the word-line coupling, a data recover read may be performed.

Figure 6:
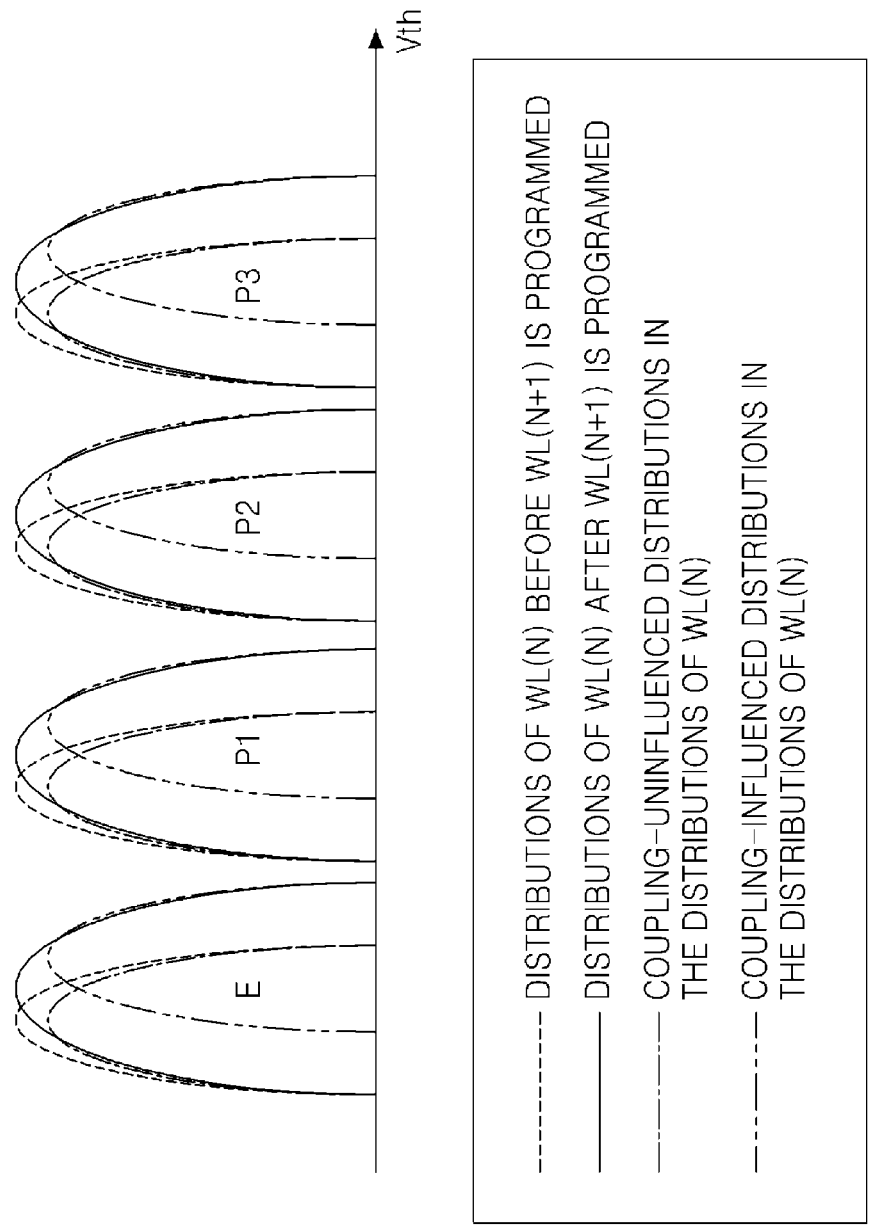
FIG. 6 is a diagram showing in detail the distributions of an N-th word line after an (N+1)-th word line is programmed.

FIG. 6 is a diagram showing in some additional detail the distributions of the N-th word line after the (N+1)-th word line is programmed. The distributions of the N-th word line WL(N) after the (N+1)-th word line WL(N+1) is programmed is divided into distributions of cells having the threshold voltages Vth changed by the word-line coupling and distributions of cells having the threshold voltage Vth unchanged by the word-line coupling. For clarity of the description, the distribution of cells having the threshold voltage Vth changed by the coupling is referred to as a coupling-influenced distribution and the distribution of cells having the threshold voltage Vth unchanged by the coupling is referred to as a coupling-uninfluenced distribution.

Accordingly, when a read operation in which two cell states are distinguished from each other is performed, it is necessary to distinguish coupling-influenced cells from coupling-uninfluenced cells and perform the read operation on the cells using different read voltages in order to reduce errors during data reading.

FIG. 7 is a diagram describing an example of a data read operation of a typical non-volatile memory device.

Referring to FIG. 7, there are four cell states in a 2-bit MLC memory device. The four states are usually denoted by E, P1, P2 and P3, respectively. FIG. 7 shows a normal read operation. The normal read operation is performed using an RD level corresponding to the median of a margin 2*a* between two states in the distributions of the N-th word line WL(N) influenced by word-line coupling.

Figure 8B:
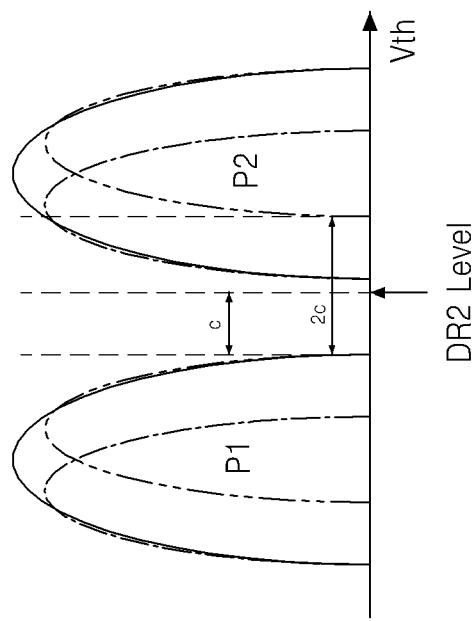

FIGS. 8A and 8B are diagrams describing another example of the data read operation of the typical non-volatile memory device.

FIGS. 8A and 8B show a data recover read operation different from the normal read operation. In the data recover read operation, two read operations are performed using different read voltages DR1 and DR2.

The read voltage DR1 is only used to read data from cells uninfluenced by coupling. In some cases, the read voltage DR1 is also used to read data from cells influenced by the coupling, but a result of reading the data from the influenced cells is not used as an effective value. The read voltage DR1 corresponds to the median of a margin 2*b* between two states of the uninfluenced cells. Similarly, the read voltage DR2 is only used to read data from the cells influenced by coupling. The read voltage DR2 corresponds to the median of a margin 2*c* between two states of the influenced cells.

In FIGS. 7, 8A and 8B, values "a", "b" and "c" are respectively used to indicate "margin" (or a level difference) between adjacent states and are assumed to have one of the following relationships: (a<b=c), (a≤b≤c) or (a≤c≤b). Accordingly, the margin between two states increases in the data recover read operation, so that read errors can be reduced.

In order to perform the data recover read operation, it is necessary to divide the cells in the N-th word line WL(N) into cells influenced by coupling between the N-th word line WL(N) and the (N+1)-th word line WL(N+1) and cells uninfluenced by the coupling. When there is a command to perform a read operation on the N-th word line WL(N), the (N+1)-th word line WL(N+1) is read first and information about coupling-influenced cells and coupling-uninfluenced cells in the N-th word line WL(N) is stored in advance.

Figure 9:
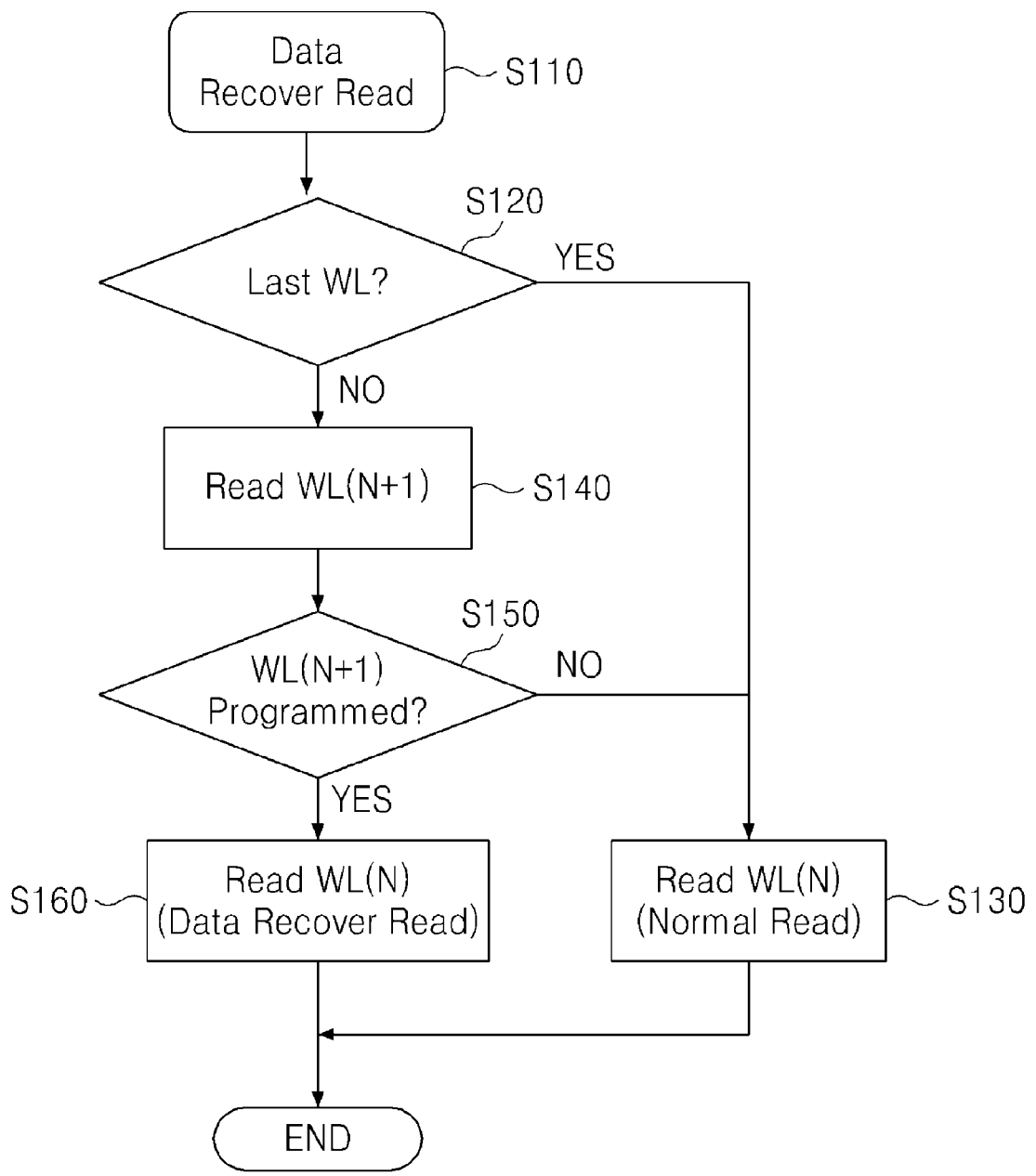
FIG. 9 is a flowchart summarizing a data read method according to certain embodiments of the inventive concept.

FIG. 9 is a flowchart summarizing a data read method according to certain embodiments of the inventive concept.

A data read command for the N-th word line WL(N) is received (S110). It is then determined whether the N-th word line WL(N) is a last WL (S120). If the N-th word line WL(N) is the last one (S120=YES), a normal read operation is performed on the N-th word line WL(N) (S130). Here, the last word line indicates the last one in program order. When it is assumed that a program operation is performed beginning with the word line WL1 toward the word line WLn in the non-volatile memory device 100 illustrated in FIG. 2, the last word line is the word line WLn adjacent to the string selection line SSL. Even if a dummy word line is provided between the string selection line SSL and the word line WLn, the last word line will be the word line WLn not the dummy word line. Alternatively, when it is assumed that a program operation is performed beginning with the word line WLn toward the word line WL1 in the non-volatile memory device 100 illustrated in FIG. 2, the last word line is the word line WL1. Even if a dummy word line is provided between the ground selection line GSL and the word line WL1, the last word line will be the word line WL1 not the dummy word line.

Referring back to FIG. 9, when the N-th word line WL(N) is not the last one (S120=NO), a read operation is performed on an adjacent word line, e.g., the (N+1)-th word line WL(N+1) or the (N−1)-th word line WL(N−1) (S140). In the current embodiments, the read operation is performed on the (N+1)-th word line WL(N+1). The read operation on the adjacent word line WL(N+1) or WL(N−1) may be different from a read operation performed on the N-th word line WL(N) that is an actual target of the read operation.

The read operation on the adjacent word line (i.e., the N+1-th word line WL(N+1) in the current embodiment) is performed to distinguish cells which give the influence of coupling and cells which do not give the influence of coupling in the (N+1)-th word line WL(N+1). For instance, the read operation is performed to identify which of a plurality of predetermined groups data read from the adjacent word line belongs to. Here, the predetermined groups indicate states of data that can be stored in the adjacent word line according to the level of coupling with respect to the N-th word line WL(N).

This read operation may be different depending on whether the non-volatile memory device is an SLC memory device or an MLC memory device and depending on program order of word lines.

It is determined whether the (N+1)-th word line WL(N+1) has been programmed (S150). When the (N+1)-th word line WL(N+1) has been programmed, not a normal read operation but a data recover read operation is performed (S160). When whether the (N+1)-th word line WL(N+1) has been programmed is checked, either or both of the least significant bit (LSB) and most significant bit (MSB) may be checked.

In the data recover read operation, data is read from the N-th word line WL(N) using different read voltages according to the state of the data read from the adjacent word line. The number of read voltages used to distinguish an erased state and a first programmed state is greater than the number of read voltages used to distinguish a second programmed state and a third programmed state.

When it is found that the (N+1)-th word line WL(N+1) has not been programmed (S150=NO), a normal read operation is performed on the N-th word line WL(N) in operation S130.

In a typical 2-bit MLC memory device, two pages are allocated to a single word line and a second page (or an MSB page) is programmed after a first page (or an LSB page) is programmed. At this time, the first page, i.e., the LSB page has two states and the second page, i.e., the MSB page has four states.

FIGS. 16 and 17 are diagrams describing a program order for a NAND flash memory device with respect to word lines.

FIG. 16 is a table showing program order in a NAND flash memory device having an all bit line architecture with respect to word lines. FIG. 17 is a table showing program order in a NAND flash memory device having a shielded bit line architecture with respect to word lines. In the shielded bit line architecture, a word line is divided into an even page and an odd page that are separately programmed. In the all bit line architecture, an even page and an odd page are not distinguished from each other in a word line.

Figure 10:
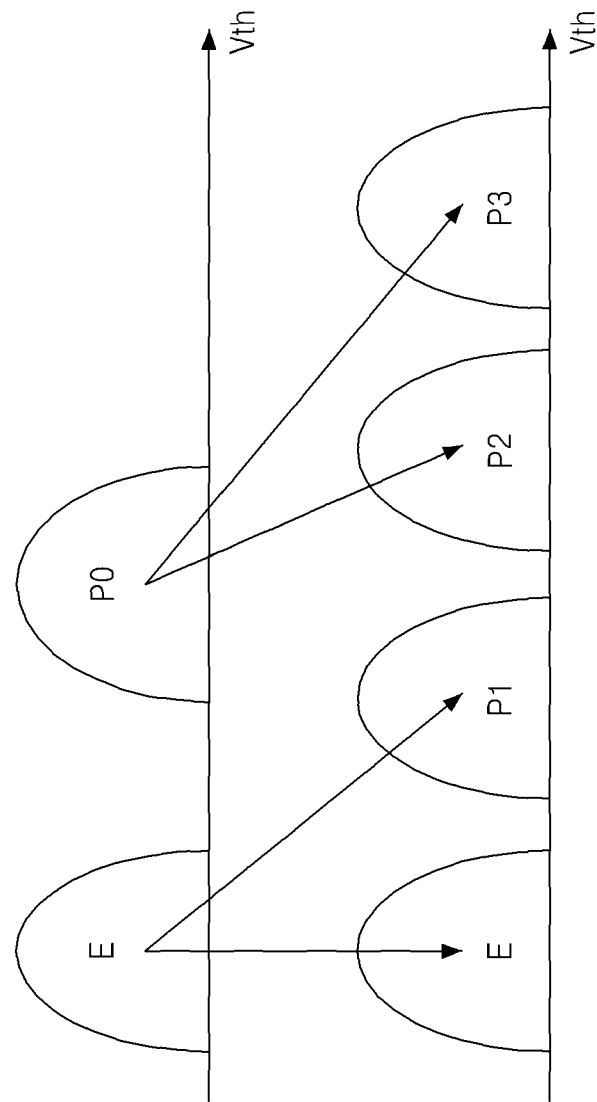
FIG. 10 is a diagram showing the changes in cell states in first and second pages with respect to a single word line.

FIG. 10 is a diagram showing the changes in cell states in first and second pages with respect to a single word line. Referring to FIG. 10, when the first page is programmed in the word line, each of the cells in the word line has one of two states E and P0. Thereafter, when the second page is programmed in the word line, each cell in the word line has one of four states E, P1, P2 and P3.

States E and P1 of the second page may be obtained from state E of the first page and states P1 and P3 of the second page may be obtained from state P0 of the first page.

In a case where a program operation is performed using the method shown in FIG. 10 in order shown in FIGS. 16 and 17, when the (N+1)-th word line WL(N+1) is programmed after the N-th word line WL(N) is programmed, the amount of influence of coupling on the N-th word line WL(N) is greater when a cell in the (N+1)-th word line WL(N+1) changes from state E to state P1 or state P0 to state P3 than when a cell in the (N+1)-th word line WL(N+1) changes state E to state E or state P0 to state P2.

Accordingly, when the N-th word line WL(N) is read, it may be determined that the N-th word line WL(N) has been influenced by the coupling when the (N+1)-th word line WL(N+1) is in state P1 or P3 and that the N-th word line WL(N) has not been influenced by the coupling when the (N+1)-th word line WL(N+1) is in state E or P2.

For clarity of the description, cells which are not influenced by the coupling in the N-th word line WL(N) (e.g., when corresponding cells in the (N+1)-th word line WL(N+1) are in state E or P2) are defined as first group cells and cells which are influenced by the coupling in the N-th word line WL(N) (e.g., when corresponding cells in the (N+1)-th word line WL(N+1) are in state P1 or P3) are defined as second group cells.

Figure 11:
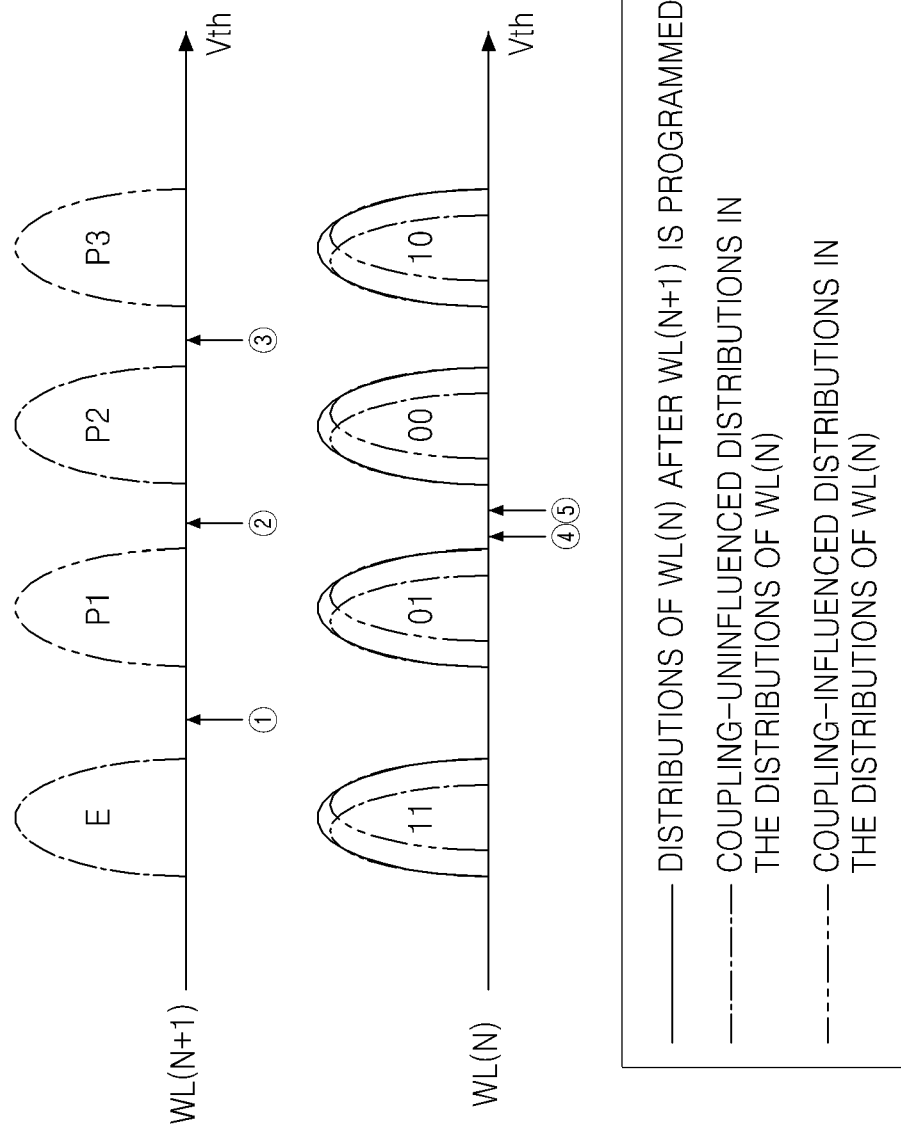
FIGS. 11 and 12 are diagrams showing a sequence of a read operation when a read command for the N-th word line is received.
Figure 12:
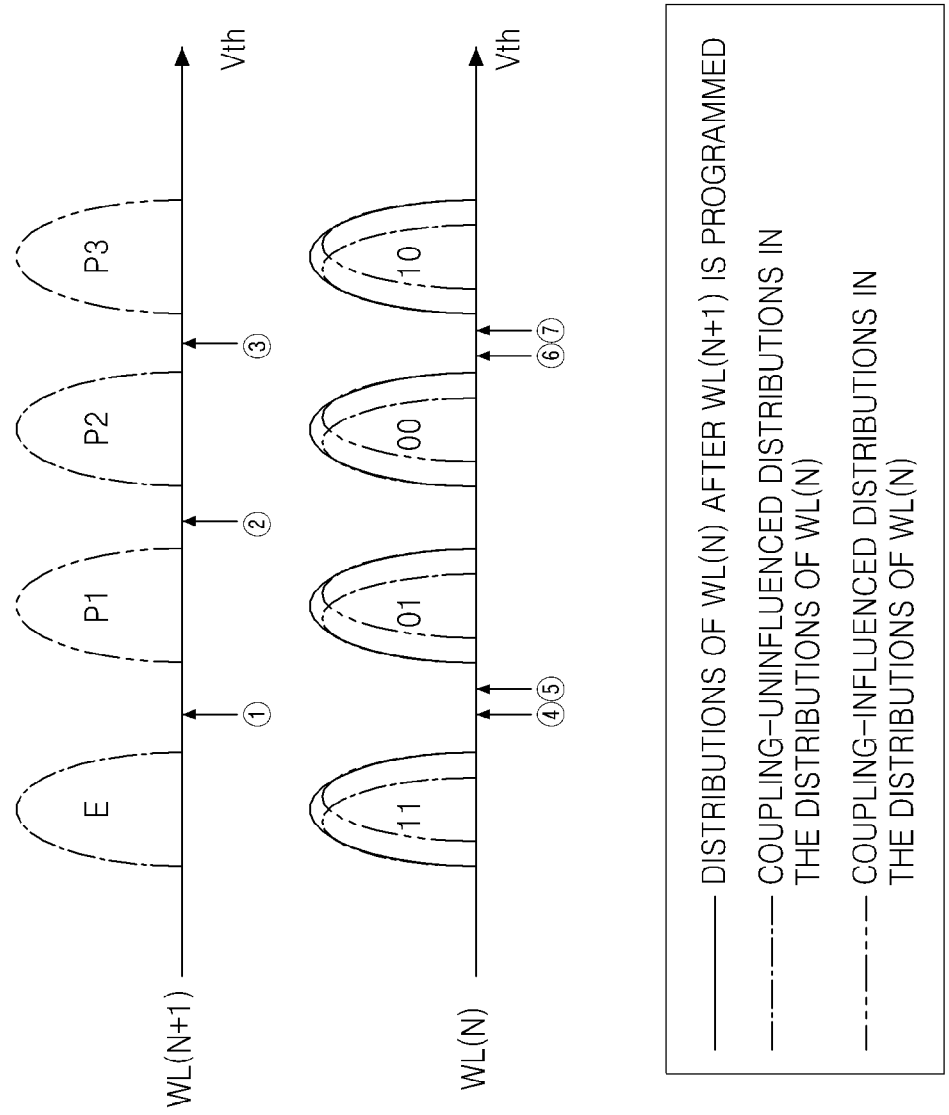

FIGS. 11 and 12 are diagrams showing a sequence of a read operation when a read command for the N-th word line is received. FIG. 11 shows the sequence of a read operation when the first page is read from the N-th word line WL(N). FIG. 12 shows the sequence of a read operation when the second page is read from the N-th word line WL(N).

Referring to FIG. 11, when the first page is read from the N-th word line WL(N), reading is performed on the (N+1)-th word line WL(N+1) in order of ①, ② and ③ to distinguish state E or P2 from state P1 or P3. Thereafter, cells in the N-th word line WL(N), whose corresponding cells in the (N+1)-th word line WL(N+1) are in state E or P2, are subjected to reading at point ④ and cells in the N-th word line WL(N), whose corresponding cells in the (N+1)-th word line WL(N+1) are in state P1 or P3, are subjected to reading at point ⑤.

Referring to FIG. 12, when the second page is read from the N-th word line WL(N), reading is performed on the (N+1)-th word line WL(N+1) in order of ①, ② and ③ to distinguish state E or P2 from state P1 or P3. Thereafter, cells in the N-th word line WL(N), whose corresponding cells in the (N+1)-th word line WL(N+1) are in state E or P2, are subjected to reading at point ④ and ⑤ and cells in the N-th word line WL(N), whose corresponding cells in the (N+1)-th word line WL(N+1) are in state P1 or P3, are subjected to reading at point ⑥ and ⑦.

Figure 13:
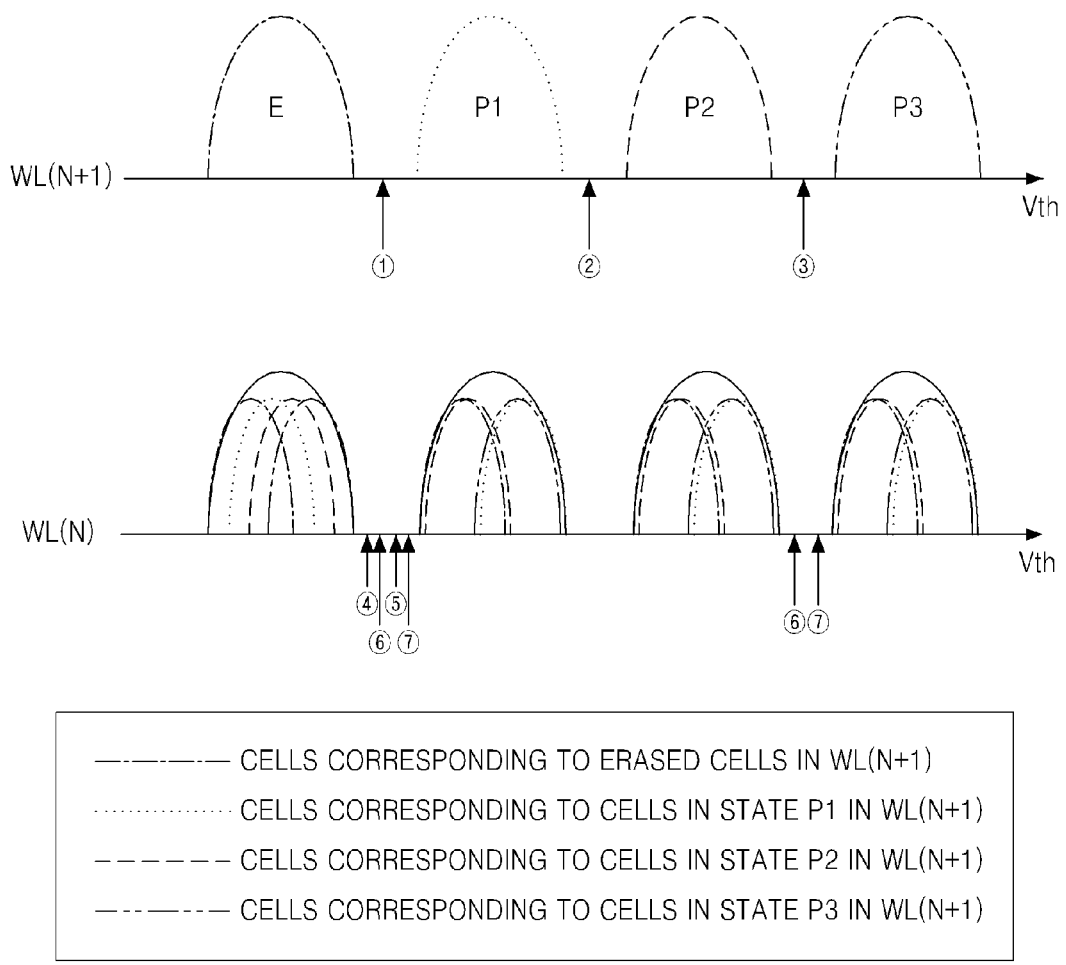
FIG. 13 is a diagram showing the distribution of cells in the N-th word line with respect to a state of the (N+1)-th word line.

FIG. 13 is a diagram showing the distribution of cells in the N-th word line WL(N) with respect to a state of the (N+1)-th word line WL(N+1).

Referring to FIG. 13, the distributions of cells in states P1, P2 and P3 in the N-th word line WL(N) when the (N+1)-th word line WL(N+1) is in state E or P1 are similar to those when the (N+1)-th word line WL(N+1) is in state P2 or P3, respectively. In other words, since the amount of influence of coupling between the word lines WL(N) and WL(N+1) on the N-th word line WL(N) when the (N+1)-th word line WL(N+1) is in state E or P2 is respectively similar to that when the (N+1)-th word line WL(N+1) is in state P1 or P3, cells in the N-th word line WL(N), which correspond to cells in state E or P2 in the (N+1)-th word line WL(N+1), are defined as coupling-uninfluenced cells, i.e., the first group cells while cells in the N-th word line WL(N), which correspond to cells in state P1 or P3 in the (N+1)-th word line WL(N+1), are defined as coupling-influenced cells, i.e., the second group cells.

However, unlike programmed cells, erased cells are increasingly influenced by coupling in order of states E, P1, P2 and P3. When the program operation is performed in order shown in FIG. 16 or 17, a first page of the (N+1)-th word line WL(N+1) has been programmed before a second page of the N-th word line WL(N) is programmed and then states P1, P2 and P3 are formed in the N-th word line WL(N), and therefore, the amount of coupling influencing the N-th word line WL(N) when state P2 or P3 is formed in the (N+1)-th word line WL(N+1) is as much as a shift from state P0. Accordingly, the amount of coupling influenced by state P2 of the (N+1)-th word line WL(N+1) is small but the amount of coupling influenced by state P3 of the (N+1)-th word line WL(N+1) is large.

Meanwhile, for the erased cells in the N-th word line WL(N), coupling influenced by state P0 formed when the second page of the N-th word line WL(N) is programmed after the first page of the (N+1)-th word line WL(N+1) is programmed cannot be invalid or eliminated, and therefore, the erased cells are increasingly influenced by coupling in order of states E, P1, P2 and P3.

FIGS. 14A through 14D are diagrams showing the distribution after the first and/or second pages of the N-th word line WL(N) and the (N+1)-th word line WL(N+1) are programmed in order according to certain embodiments of the inventive concept. As shown in FIGS. 14A through 14D, changes in a distribution of cells in state E with respect to the state of the (N+1)-th word line WL(N+1) are different from changes in distribution of cells in state P1, P2 or P3 with respect to the state of the (N+1)-th word line WL(N+1).

FIG. 14A shows cell distributions after the first page of the N-th word line WL(N) is programmed and before the first page of the (N+1)-th word line WL(N+1) is programmed. FIG. 14B shows cell distributions after the first pages of both the N-th and (N+1)-th word lines WL(N) and WL(N+1) are programmed. Referring to FIGS. 14A and 14B, the cell distributions of the N-th word line WL(N) have almost no changes when cells in the (N+1)-th word line WL(N+1) are in state E, but the cell distributions of the N-th word line WL(N) shift to the right due to word-line coupling when cells in the (N+1)-th word line WL(N+1) are in state P0.

FIG. 14C shows cell distributions after the first page of the (N+1)-th word line WL(N+1) and then the second page of the N-th word line WL(N) are programmed. Referring to FIG. 14C, when a cell in the N-th word line WL(N) is programmed to state P1, P2 or P3, word-line coupling effect given by the (N+1)-th word line WL(N+1) programmed to state P0 is nullified. However, when a cell in the N-th word line WL(N) is in state E, the word-line coupling effect remains.

FIG. 14D shows cell distributions after the second page of the (N+1)-th word line WL(N+1) is programmed.

FIG. 15 is a diagram describing a method of reading the second page according to certain embodiments of the inventive concept. A positional relation between a distribution of cells in state E and a distribution of cells in state P1 in the N-th word line WL(N) changes with the state of the (N+1)-th word line WL(N+1), and therefore, reading is performed four times between state E and state P1, as shown in FIG. 15, while two times of read is performed between state P2 and state P3. Performing reading four times using four different read voltages to distinguish cells in state E and cells in state P1 brings an effect of increasing a margin between state E and state P1. As a result, read error are reduced.

At this time, four times of reading are performed with respect to state E, P1, P2 and P3, respectively, of the (N+1)-th word line WL(N+1). A first read voltage ④ is obtained using the above-described method of determining a read voltage, that is, it corresponds to a median between distributions of cells when cells in the (N+1)-th word line WL(N+1) are in state E. Similarly, three other read voltages ⑤, ⑥ and ⑦ are medians between distributions of cells when cells in the (N+1)-th word line WL(N+1) are in states P1, P2 and P3, respectively.

When cells in a current selected word line are in a programmed state, a distribution of the cells is influenced by word-line coupling only when an adjacent word line is programmed after the current word line. However, when cells in the current word line are in an erased state, a distribution of the cells is always influenced by the word-line coupling regardless of whether the adjacent word line is programmed before the current word line. Accordingly, cells influenced by coupling given by the (N−1)-th word line WL(N−1) may be identified as well when a read operation is performed in order to increase the margin between state E and state P1 in the N-th word line WL(N).

Figure 18:
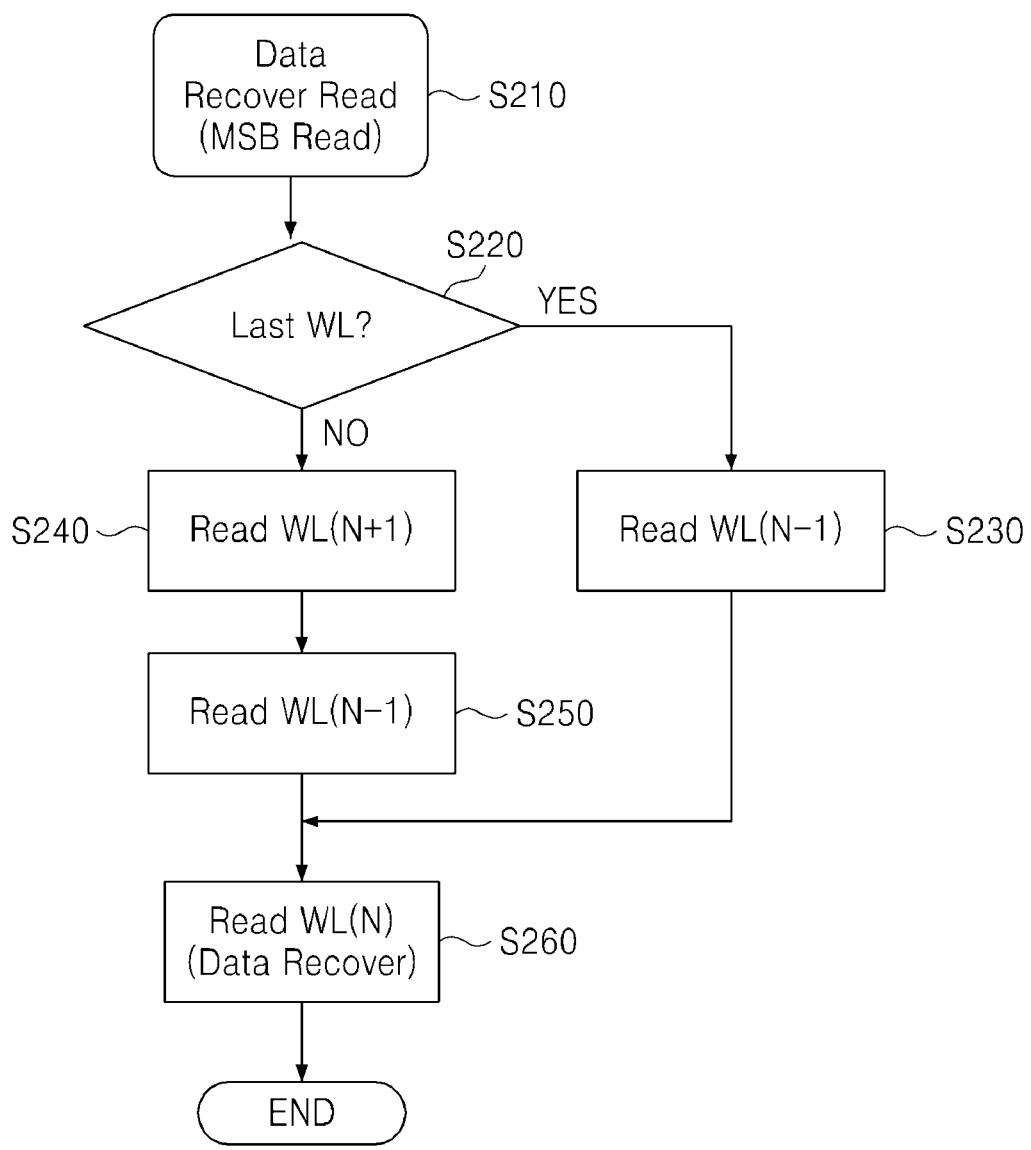
FIG. 18 is a flowchart summarizing a data read method according to other embodiments of the inventive concept.

FIG. 18 is a flowchart summarizing a data read method according to certain embodiments of the inventive concept. In particular, FIG. 18 shows a method of reading an MSB. The method as shown in FIG. 9 may be performed with respect to an LSB.

Referring to FIG. 18, a data read command directed to a non-volatile multi-level (NVML) first memory cell connected to the N-th word line WL(N) is received (S210). It is determined whether the N-th word line WL(N) is a last WL (S220). When the N-th word line WL(N) is last (S220=YES), the (N−1)-th word line WL(N−1) is read (S230).

When the N-th word line WL(N) is not last (S220=NO), a second NVML memory cell connected to the adjacent word line, e.g., the (N+1)-th word line WL(N+1), is read (S240). Thereafter, the (N−1)-th word line WL(N−1) is read (S250) to determine an amount of coupling influence the first NVML memory cell connected to the N-th word line WL(N).

In other words, during a read operation directed to at least the first NVML memory cell connected to the N-th word line WL(N), reading is performed in relation to at least one of a second NVML memory cell connected to one adjacent word line (e.g., the (N+1)-th word line) and/or a third NVML memory cell connected to another adjacent word line (e.g., the (N−1)-th word line) in order to determine an amount of coupling influence on the first NVML memory cell connected to the N-th word line WL(N). However, when the N-th word line WL(N) is the last word line (S220=YES), reading is performed on only the (N−1)-th word line WL(N−1) to determine the amount of coupling influence on the first NVML memory cell connected to the N-th word line WL(N) (S230). Accordingly, when reading is performed "on the N-th word line" (i.e., when data is read from one or more memory cell(s) connected to the N-th word line), the number of read operations (or sub-operations forming the read operation executed in response to the received command—hereafter "readings"), as well as particular grouping of cells according to different amounts of coupling influence may vary according to different levels of coupling influence.

When only coupling effects between adjacent word lines (e.g., the N-th word line and the (N+1)-th word line) are considered, the adverse influence on the threshold voltages of proximate memory cells caused by the coupling effects increases in the order of the E, P1, P2 and P3 states. However, when the "combined" coupling effects of both adjacent word lines (e.g., both WL(N+1) and WL(N−1) relative to WL(N)) are considered, a number of memory cells groups may vary according to difference(s) in the verify voltage level(s) between respective states. For instance, under the foregoing assumptions, a number of groups may be a maximum of 16 but the scope of the inventive concept is not restricted thereto.

As described above, erased cells are always influenced by coupling effects caused by adjacent word lines, regardless of programming order.

When programming is performed in the order described in relation to FIGS. 16 and 17, the position of a distribution of erased cells is different from the position of a distribution of programmed cells according to the state of the "aggressor memory cell(s)" (i.e., the memory cell(s) causing the coupling effects). Accordingly, margin can be increased by performing a number of readings respectively using read voltages having different levels when programmed cells are being distinguished from each other.

As noted already, erased cells are particularly vulnerable to read disturbance. The read disturbance is a disturbance upon a cell that happened when a read operation is performed. Hence, when the number of readings is increases, the probability of a read error associated with the erased cell also increases. To solve this problem, data in a current block may be programmed to another block when the number of readings performed on the current block is greater than a predetermined number.

FIG. 19 is a diagram showing voltages applied to word lines during a read operation according to certain embodiments of the inventive concept. FIGS. 20A through 20E are tables showing values stored in a buffer during the read operation according to certain embodiments of the inventive concept.

Referring to FIGS. 19 through 20E, it is assumed that a read operation, as indicated by a read command, is directed to a first memory cell connected to a first word line WL(N) line, and that a second word line WL(N+1) connected to a second memory cell is adjacent to the first word line WL(N). The entries S, M, L and F denote elements included in a page buffer and may be implemented by latch elements. For instance, S denotes a sensing latch.

Figure 20A:

Referring to FIG. 20A, reading is performed on the word line WL(N+1) in operation ①. During this operation, voltages RD1, RD2 and RD3 are sequentially applied to the word line WL(N+1) while a voltage VREAD is applied to the word line WL(N). As a result of performing the reading on the word line WL(N+1), a cell in state E or P2 (i.e., a cell that is not an aggressor and is referred to as a "non-aggressor cell") is set as S latch=M latch=1 and a cell in state P1 or P3 (i.e., the aggressor cell) is set as S latch=M latch=0.

Figure 20B:

Referring to FIG. 20B, reading is performed on the word line WL(N) using a voltage DR1-1 in operation ②. As a result of the reading, only cells having M=1 among off-cells having S=0 are set as L=0.

Figure 20C:

Referring to FIG. 20C, reading is performed on the word line WL(N) using a voltage DR1-2 in operation ③. As a result of the reading, only cells having M=0 among off-cells having S=0 are set as L=0.

Figure 20D:
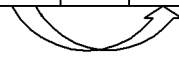

Referring to FIG. 20D, reading is performed on the word line WL(N) using a voltage DR3-1 in operation ④. As a result of the reading, only cells having M=1 among off-cells having S=0 are set as L=1.

Referring to FIG. 20E, reading is performed on the word line WL(N) using a voltage DR3-2 in operation ⑤. As a result of the reading, only cells having M=0 among off-cells having S=0 are set as L=1.

FIG. 21 is a diagram showing voltages applied to word lines in a data read operation according to other embodiments of the inventive concept. FIGS. 22A through 22G are tables showing values stored in a buffer in the data read operation according to other embodiments of the inventive concept. Similar assumptions as set forth above are made for the example illustrated in FIGS. 21 through 22G.

Referring to FIG. 22A, reading is performed on the word line WL(N+1) in operation ①. In this operation, voltages RD1, RD2 and RD3 are sequentially applied to the word line WL(N+1) while a voltage VREAD is applied to the word line WL(N). As a result of performing the reading on the word line WL(N+1), a cell in state E is set as (M,F)=(1,1); a cell in state P1 is set as (M,F)=(0,1); a cell in state P2 is set as (M,F)=(1,0); and a cell in state P3 is set as (M,F)=(0,0).

Referring to FIG. 22B, reading is performed on the word line WL(N) using a voltage DR1-1 in operation ②. As a result of the reading, only cells having (M,F)=(1,1) among off-cells having S=0 are set as L=0.

Referring to FIG. 22C, reading is performed on the word line WL(N) using a voltage DR1-2 in operation ③. As a result of the reading, only cells having (M,F)=(0,1) among off-cells having S=0 are set as L=0.

Referring to FIG. 22D, reading is performed on the word line WL(N) using a voltage DR1-3 in operation ④. As a result of the reading, only cells having (M,F)=(1,0) among off-cells having S=0 are set as L=0.

Referring to FIG. 22E, reading is performed on the word line WL(N) using a voltage DR1-4 in operation ⑤. As a result of the reading, only cells having (M,F)=(0,0) among off-cells having S=0 are set as L=0.

Referring to FIG. 22F, reading is performed on the word line WL(N) using a voltage DR3-1 in operation ⑥. As a result of the reading, only cells having M=1 among off-cells having S=0 are set as L=1.

Referring to FIG. 22G, reading is performed on the word line WL(N) using a voltage DR3-2 in operation ⑦. As a result of the reading, only cells having M=0 among off-cells having S=0 are set as L=1.

The above-described embodiments relate to read methods capable of reducing the influence of coupling effect from adjacent word lines but the inventive concept is not restricted to only these embodiments. For instance, a read method according to other embodiments of the inventive concept may be used to reduce the influence of coupling effects from non-adjacent (albeit proximate word lines) and/or between adjacent (or proximate) bit lines.

Figure 23:
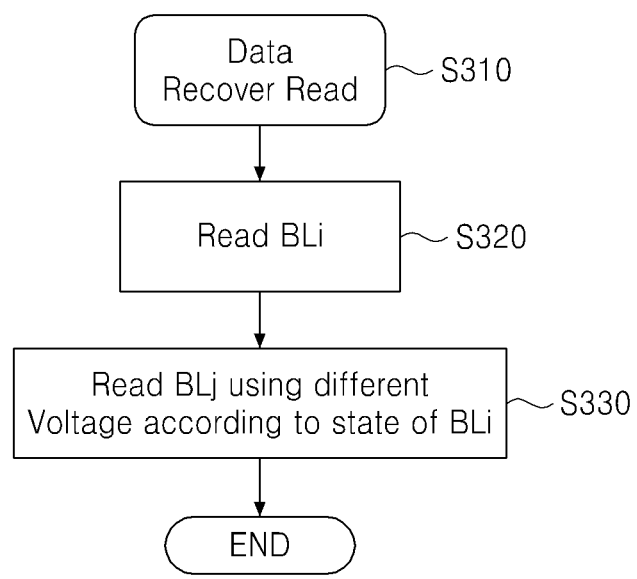
FIG. 23 is a flowchart summarizing a data read method according to further embodiments of the inventive concept.
Figure 24A:
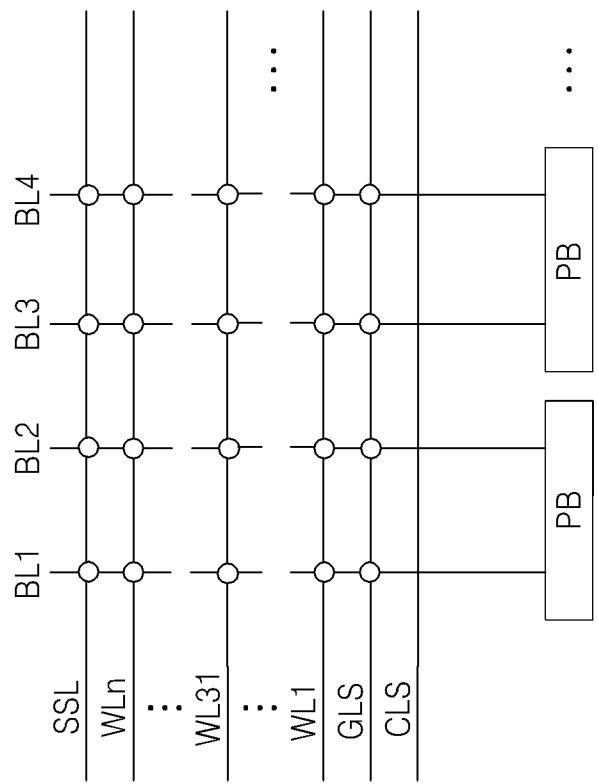
FIGS. 24A and 24B are diagrams describing the data read method illustrated in FIG. 23.
Figure 24B:
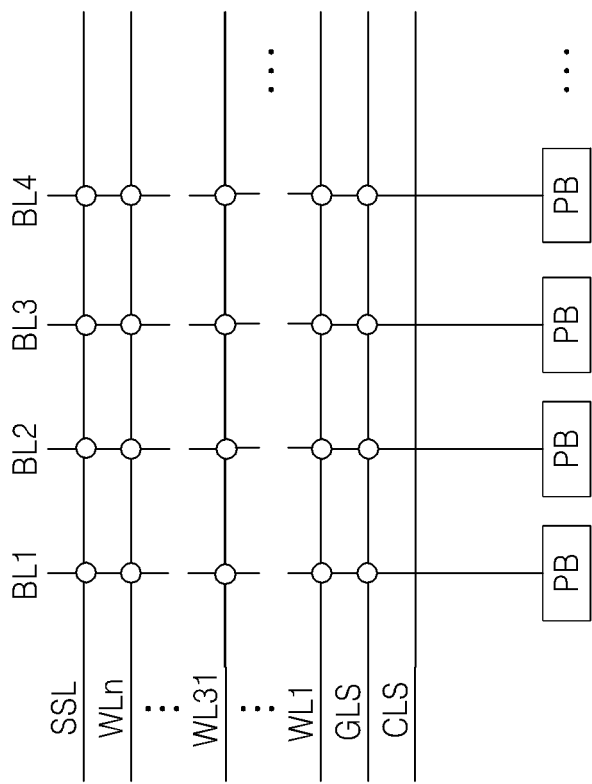

FIG. 23 is a flowchart summarizing a read method according to certain embodiments of the inventive concept. FIGS. 24A and 24B are diagrams further describing the read method illustrated in FIG. 23.

Referring to FIG. 23, a read command indicating a read operation is directed to a first memory cell connected to an N-th word line (S310). In response to the read command, data is read from a memory cell (i.e., a state of the memory cell is determined) connected to an i-th bit line BLi among memory cells connected to the N-th word line (S320).

Thereafter, a data recover read operation is performed on data stored in a memory cell connected to a j-th bit line BLj among the memory cells connected to the N-th word line based on a state of the data read from the i-th bit line BLi (S330). According to the state of the data read from the i-th bit line BLi, the data may be read from the j-th bit line BLj using one or more particular control voltage(s) having defined levels.

The i-th bit line BLi and the j-th bit line BLj may be adjacent to each other.

Referring to FIG. 24A, the i-th bit line BLi and the j-th bit line BLj may share a single page buffer PB with each other and may be read sequentially in a shielded bit line architecture. In this case, the i-th bit line BLi may be an even bit line and the j-th bit line BLj may be an odd bit line, or vice versa.

Here, data read from the i-th bit line BLi may be stored in a latch element (not shown) in the shared page buffer PB and used when data is read from the j-th bit line BLj.

Alternatively, referring to FIG. 24B, separate page buffers PB may be respectively used for the i-th and j-th bit lines BLi and BLj, so that data is read simultaneously or in parallel from the both bit lines BLi and BLj in an all bit line architecture. In this case, the i-th bit line BLi may be an even bit line and the j-th bit line BLj may be an odd bit line, or vice versa.

Here, data read from the i-th bit line BLi may be stored in a page buffer PB connected with the i-th bit line BLi or transmitted to a page buffer PB connected with the j-th bit line BLj so as to be used when data is read from the j-th bit line BLj.

Figure 25:
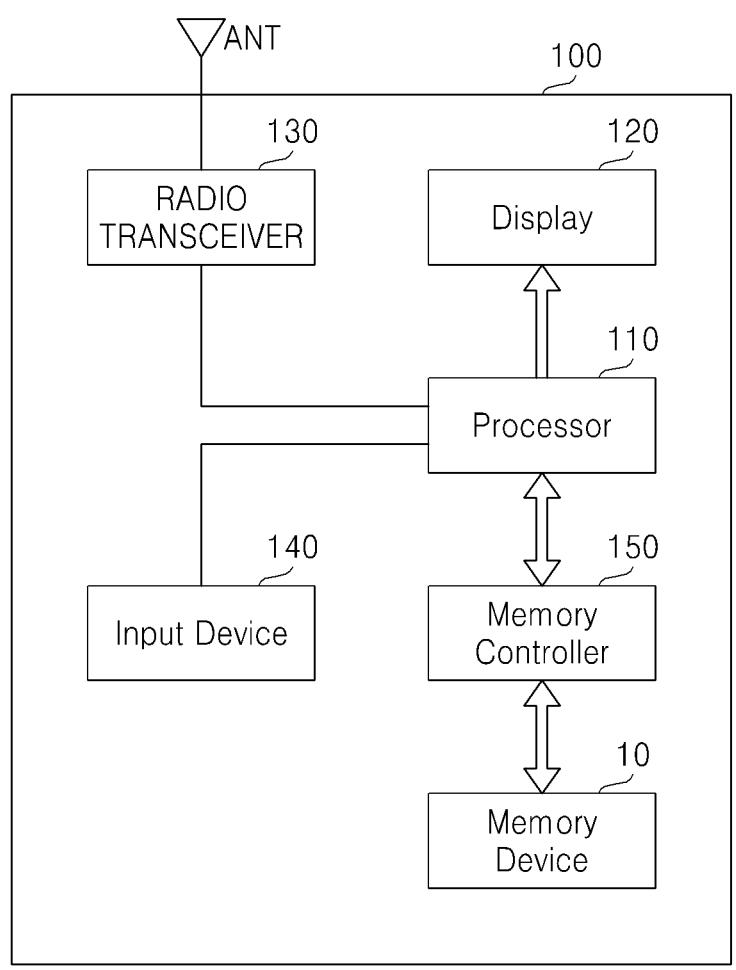
FIG. 25 is a block diagram of a memory system including the non-volatile memory device illustrated in FIG. 2 according to certain embodiments of the inventive concept.

FIG. 25 is a block diagram of a memory system 100 including the non-volatile memory device 10 illustrated in FIG. 2 according to certain embodiments of the inventive concept. Referring to FIGS. 2 through 25, the memory system 100 may be implemented as a cellular phone, a smart phone, a tablet personal computer (PC), a personal digital assistant (PDA) or a radio communication system.

The memory system 100 includes the non-volatile memory device 10 and a memory controller 150 controlling the operations of the non-volatile memory device 10. The memory controller 150 may control the data access operations, e.g., a program operation, an erase operation, and a read operation, of the non-volatile memory device 10 according to the control of a processor 110.

The data programmed in the non-volatile memory device 10 may be displayed through a display 120 according to the control of the processor 110 and/or the memory controller 150.

A radio transceiver 130 transmits or receives radio signals through an antenna ANT. The radio transceiver 130 may convert radio signals received through the antenna ANT into signals that can be processed by the processor 110. Accordingly, the processor 110 may process the signals output from the radio transceiver 130 and transmit the processed signals to the memory controller 150 or the display 120. The memory controller 150 may program the signals processed by the processor 110 to the non-volatile memory device 10. The radio transceiver 130 may also convert signals output from the processor 110 into radio signals and outputs the radio signals to an external device through the antenna ANT.

An input device 140 enables control signals for controlling the operation of the processor 110 or data to be processed by the processor 110 to be input to the memory system 100. The input device 140 may be implemented by a pointing device such as a touch pad or a computer mouse, a keypad, or a keyboard.

The processor 110 may control the operation of the display 120 to display data output from the memory controller 150, data output from the radio transceiver 130, or data output from the input device 140. The memory controller 150, which controls the operations of the non-volatile memory device 10, may be implemented as a part of the processor 110 or as a separate chip.

Figure 26:
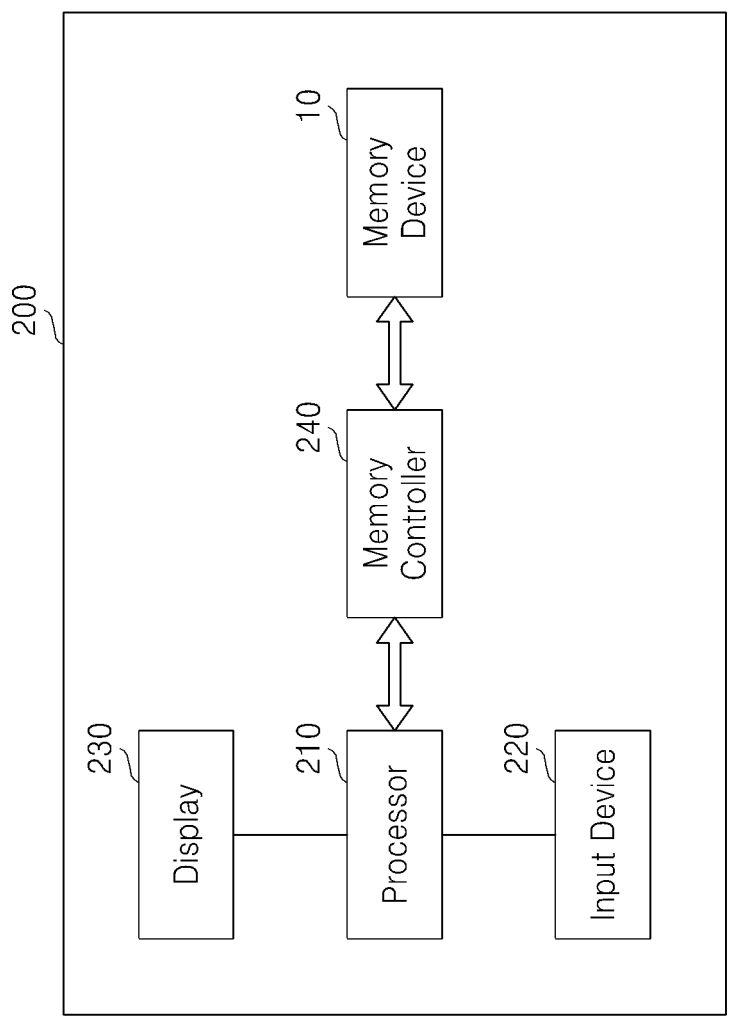
FIG. 26 is a block diagram of a memory system including the non-volatile memory device illustrated in FIG. 2 according to other embodiments of the inventive concept.

FIG. 26 is a block diagram of a memory system 200 including the non-volatile memory device 10 illustrated in FIG. 2 according to other embodiments of the inventive concept. The memory system 200 may be implemented as a PC, a tablet PC, a net-book, an e-reader, a PDA, a portable multimedia player (PMP), an MP3 player, or an MP4 player.

The memory system 200 includes the non-volatile memory device 10 and a memory controller 240 controlling the data processing operations of the non-volatile memory device 10. A processor 210 may display data stored in the non-volatile memory device 10 through a display 230 according to data input through an input device 220. The input device 220 may be implemented by a pointing device such as a touch pad or a computer mouse, a keypad, or a keyboard.

The processor 210 may control the overall operation of the memory system 200 and the operations of the memory controller 240. The memory controller 240, which may control the operations of the non-volatile memory device 10, may be implemented as a part of the processor 210 or as a separate chip.

Figure 27:
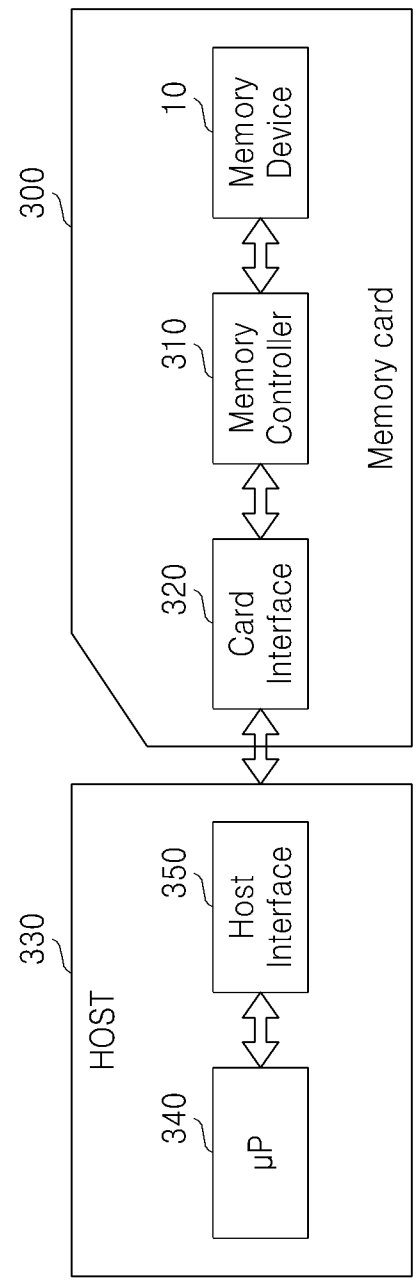
FIG. 27 is a block diagram of a memory system including the non-volatile memory device illustrated in FIG. 2 according to further embodiments of the inventive concept.

FIG. 27 is a block diagram of a memory system 300 including the non-volatile memory device 10 illustrated in FIG. 2 according to further embodiments of the inventive concept. The memory system 300 may be implemented as a memory card or a smart card. The memory system 300 includes the non-volatile memory device 10, a memory controller 310, and a card interface 320.

The memory controller 310 may control data exchange between the non-volatile memory device 10 and the card interface 320. The card interface 320 may be a secure digital (SD) card interface or a multi-media card (MMC) interface, but the inventive concept is not restricted to the current embodiments.

The card interface 320 may interface a host 330 and the memory controller 310 for data exchange according to a protocol of the host 330. The card interface 320 may support a universal serial bus (USB) protocol and an interchip (IC)-USB protocol. Here, the card interface 320 may indicate a hardware supporting a protocol used by the host 330, a software installed in the hardware, or a signal transmission mode.

When the memory system 300 is connected with a host interface 350 of the host 330 such as a PC, a tablet PC, a digital camera, a digital audio player, a cellular phone, a console video game hardware, or a digital set-top box, the host interface 350 of the host 330 may perform data communication with the non-volatile memory device 10 through the card interface 320 and the memory controller 310 according to the control of a microprocessor 340.

Figure 28:
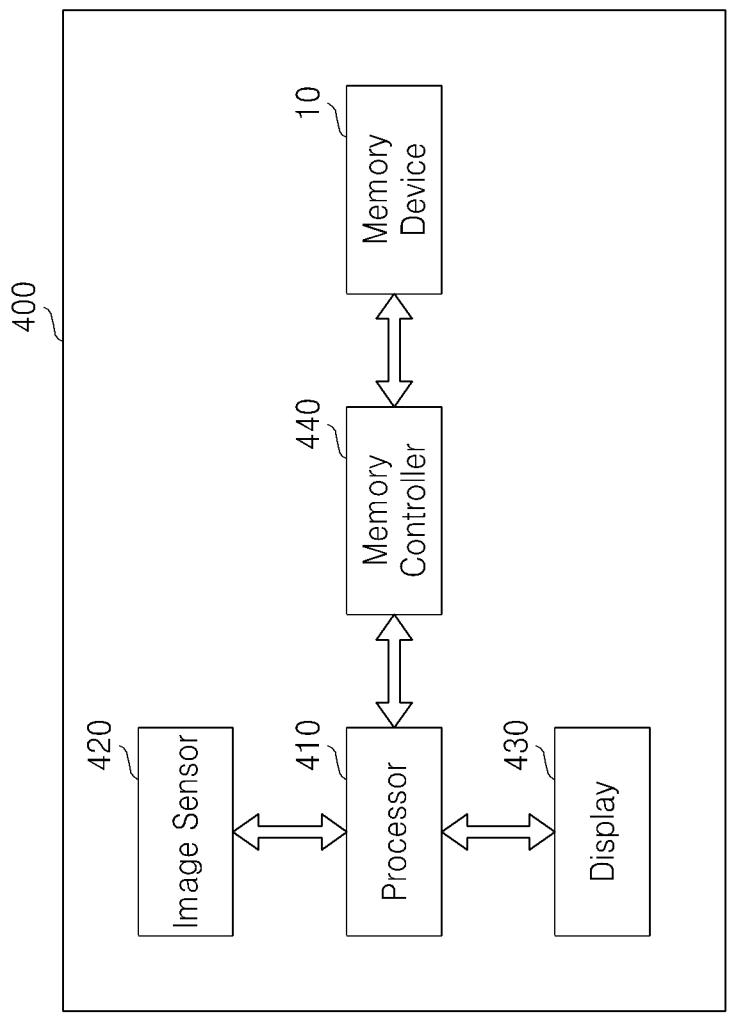
FIG. 28 is a block diagram of a memory system including the non-volatile memory device illustrated in FIG. 2 according to other embodiments of the inventive concept.

FIG. 28 is a block diagram of a memory system 400 including the non-volatile memory device 10 illustrated in FIG. 2 according to other embodiments of the inventive concept. The memory system 400 may be implemented as an image processor like a digital camera, a cellular phone equipped with a digital camera, a smart phone equipped with a digital camera, or a tablet PC equipped with a digital camera.

The memory system 400 includes the non-volatile memory device 10 and a memory controller 440 controlling the data processing operations, such as a program operation, an erase operation, and a read operation, of the non-volatile memory device 10. An image sensor 420 included in the memory system 400 converts optical images into digital signals and outputs the digital signals to a processor 410 or the memory controller 440. The digital signals may be controlled by the processor 410 to be displayed through a display 430 or stored in the non-volatile memory device 10 through the memory controller 440.

Data stored in the non-volatile memory device 10 may be displayed through the display 430 according to the control of the processor 410 or the memory controller 440. The memory controller 440, which may control the operations of the non-volatile memory device 10, may be implemented as a part of the processor 410 or as a separate chip.

Figure 29:
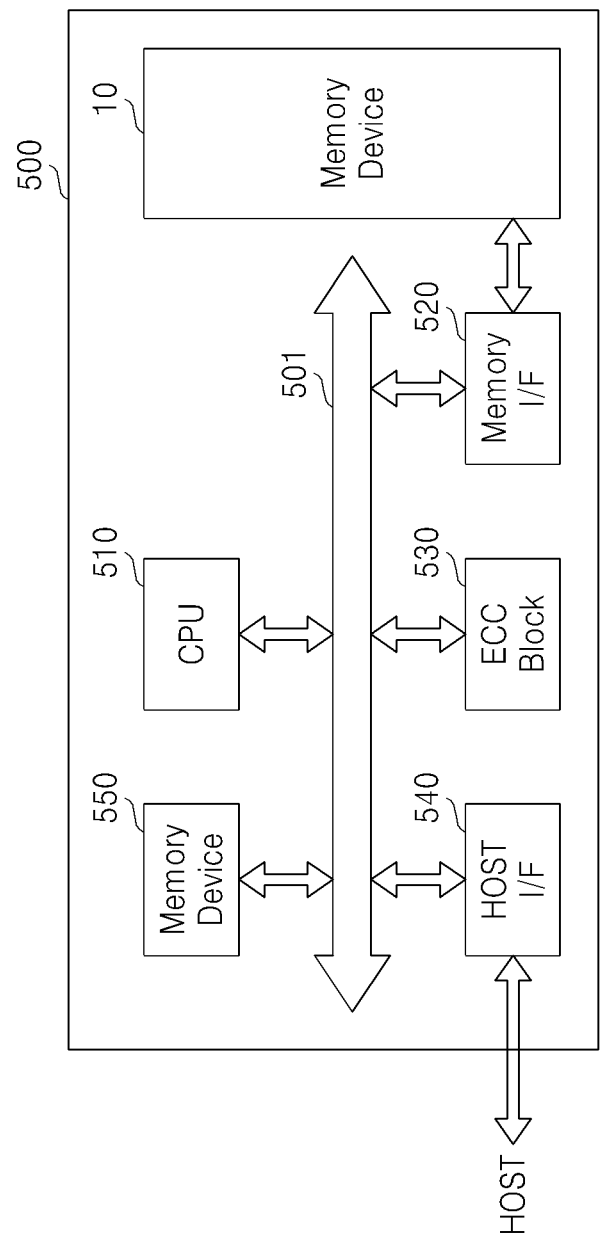
FIG. 29 is a block diagram of a memory system including the non-volatile memory device illustrated in FIG. 2 according to yet other embodiments of the inventive concept.

FIG. 29 is a block diagram of a memory system 500 including the non-volatile memory device 10 illustrated in FIG. 2 according to yet other embodiments of the inventive concept. The memory system 500 includes the non-volatile memory device 10 and a central processing unit (CPU) 510 controlling the operations of the non-volatile memory device 10.

The memory system 500 also includes a memory device 550 that may be used as an operation memory of the CPU 510. The memory device 550 may be implemented by a non-volatile memory like read-only memory (ROM) or a volatile memory like static random access memory (SRAM). A host connected with the memory system 500 may perform data communication with the non-volatile memory device 10 through a memory interface 520 and a host interface 540.

An error correction code (ECC) block 530 is controlled by the CPU 510 to detect an error bit included in data output from the non-volatile memory device 10 through the memory interface 520, correct the error bit, and transmit the error-corrected data to the host through the host interface 540. The CPU 510 may control data communication among the memory interface 520, the ECC block 530, the host interface 540, and the memory device 550 through a bus 501. The memory system 500 may be implemented as a flash memory drive, a USB memory drive, an IC-USB memory drive, or a memory stick.

Figure 30:
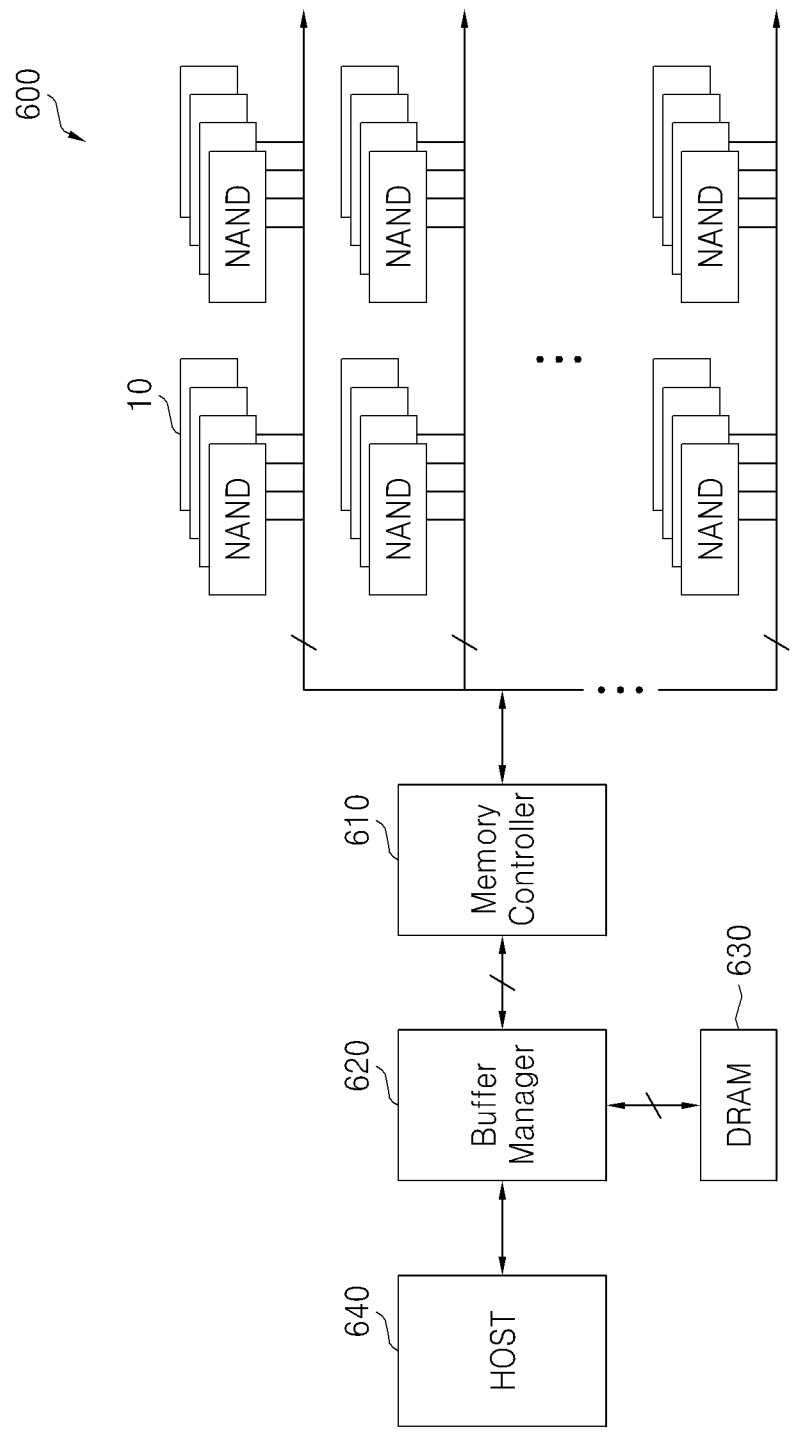
FIG. 30 is a block diagram of a memory system including the non-volatile memory device illustrated in FIG. 2 according to still other embodiments of the inventive concept.

FIG. 30 is a block diagram of a memory system 600 including the non-volatile memory device 10 illustrated in FIG. 2 according to still other embodiments of the inventive concept. The memory system 600 may be implemented as a data storage system like a solid state drive (SSD).

The memory system 600 includes a plurality of non-volatile memory devices 10, a memory controller 610 controlling the data processing operations of the non-volatile memory devices 10, a volatile memory device 630 like a dynamic random access memory (DRAM), and a buffer manager 620 controlling data transferred between the memory controller 610 and a host 640 to be stored in the volatile memory device 630.

Figure 31:
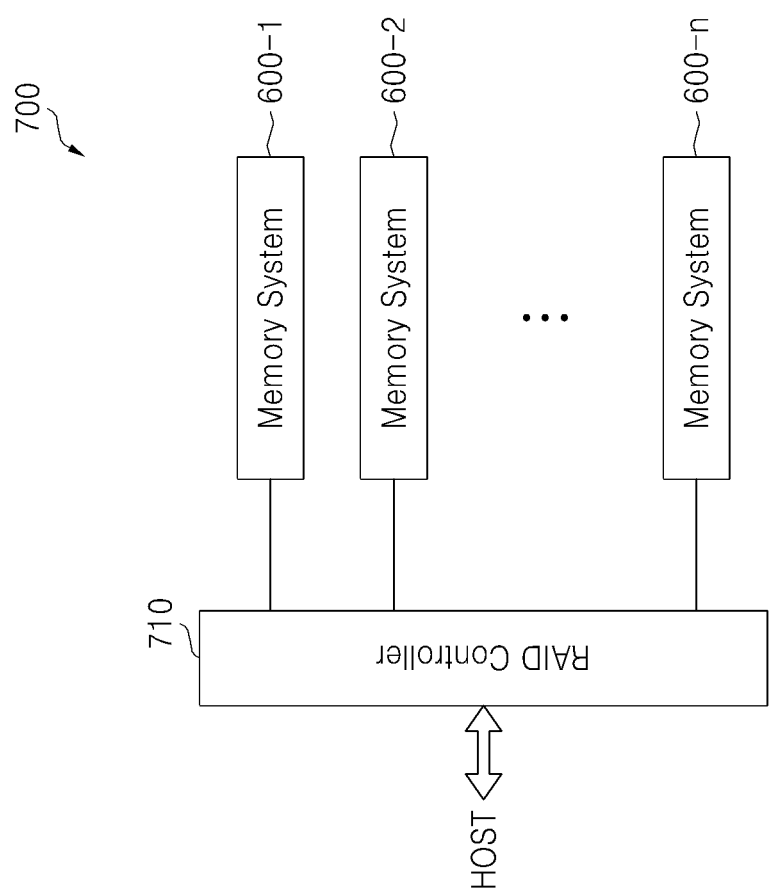
FIG. 31 is a block diagram of a data processor including the memory system illustrated in FIG. 30.

FIG. 31 is a block diagram of a data processor 700 including the memory system 600 illustrated in FIG. 30. Referring to FIGS. 30 and 31, the data processor 700 may be implemented as a redundant array of independent disks (RAID) system. The data processor 700 includes a RAID controller 710 and a plurality of memory systems 600-1 through 600-n where "n" is a natural number.

Each of the memory systems 600-1 through 600-n may be the memory system 600 illustrated in FIG. 30. The memory systems 600-1 through 600-n may form a RAID array. The data processor 700 may be a PC or an SSD.

During a program operation, the RAID controller 710 may output program data output from a host to at least one of the memory systems 600-1 through 600-n according to a RAID level in response to a program command received from the host. During a read operation, the RAID controller 710 may transmit to the host data read from at least one of the memory systems 600-1 through 600-n in response to a read command received from the host.

The inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. Also, a program code to perform the method of estimating object information may be transmitted in the form of carrier wave (i.e., transmission over the internet).

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to certain embodiments of the inventive concept, read errors caused by coupling between adjacent cells in a read operation of a non-volatile memory device. In particular, when a cell in an erased state and a cell in a first programmed state are distinguished from each other in the read operation, the number of fail bits is reduced.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A method of operating a non-volatile memory device including first through N-th word lines, a plurality of bit lines and non-volatile multi-level memory cells respectively connected between the first through N-th word lines and the bit lines, where N is an integer greater than or equal to 2, the method comprising:
   receiving a read command directed to a first memory cell connected to an M-th word line (WL), where M is an integer ranging from 1 to N−1;
   in response to the read command, reading data from at least one of a memory cell connected to word lines adjacent to the M-th word line;
   selecting at least one of a first group of read voltages and a second group of read voltages from among a plurality of predetermined groups of read voltages in response to the data read from the at least one of a memory cell connected to word lines adjacent to the M-th word line; and
   distinguishing between an erased state and a first programmed state for the first memory cell using a first read voltage selected from the first group of read voltages, and distinguishing between a second programmed state and a third programmed state for the first memory cell using a second read voltage selected from the second group of read voltages,
   wherein a number of read voltages in the first group of read voltages is greater than a number of read voltages in the second group of read voltages.

2. The method of claim 1, wherein the at least one of a memory cell connected to word lines adjacent to the M-th word line comprises a memory cell connected to a (M+1) th word line.

3. The method of claim 2, wherein the at least one of a memory cell connected to word lines adjacent to the M-th word line further comprises further comprises a memory cell connected to a (M−1) th word line.

4. The method of claim 1, wherein each of the non-volatile multi-level memory cells stores 2-bit data.

5. The method of claim 4, wherein the number of read voltages in the first group of read voltages is 16.

6. A non-volatile memory device comprising:
   a memory cell array comprising a string selection line, a ground selection line, first through N-th word lines disposed between the ground selection line and the string selection line, a plurality of bit lines and non-volatile multi-level memory cells connected between the first through N-th word lines and the bit lines, where N is an integer greater than 2; and
   an access circuit configured to read data from a second memory cell connected to word line (WL) adjacent to an K-th WL in response to a read command directed to a first memory cell connected to the K-th WL, wherein K is an integer greater than or equal to 1 and smaller than or equal to N−1, and the first memory cell is capable of being programmed to an erase state, a first programmed state, a second programmed state, and a third programmed state, and
   the access circuit is further configured in response to a data read from the second memory cell to select a first read voltage selected from a first group of read voltages when discriminating between the erase state and the first programmed state and select a second read voltage selected from a second group of read voltages when discriminating between the second programmed state and the third programmed state, wherein a number of read voltages in the first group of read voltages is greater than the second group of read voltages.

7. The non-volatile memory device of claim 6, wherein each of the non-volatile memory cells is a multi-level cell that has one of L states where L is 3 or an integer greater than 3, and
   the number of voltages used to distinguish the erased state and the first programmed state is L.

8. The non-volatile memory device of claim 6, wherein each of the non-volatile multi-level memory cells stores 2-bit data.

9. The non-volatile memory device of claim 8, wherein the number of read voltages used to distinguish the erased state and the first programmed state is 4, and
   the number of read voltages used to distinguish the second programmed state and the third programmed state is 2.

10. The non-volatile memory device of claim 6, wherein the adjacent word line comprises an (K+1)-th WL.

11. The non-volatile memory device of claim 3, wherein the adjacent word line further comprises an (K−1)-th WL.

12. The non-volatile memory device of claim 6, wherein the access circuit comprises a page buffer including four latches and configured to store data read from the memory cell array.

13. The non-volatile memory device of claim 12, wherein the four latches include:
- an S latch configured to sense and latch data of the K-th WL or the adjacent WL;
- an M latch and an F latch configured to identify a state of the data read from the adjacent WL; and
- an L latch selectively changed from an initial value and set based on a value sensed from the K-th WL and stored in the S latch and respective values stored in the M and F latches.

14. A memory system comprising:
a non-volatile memory device; and
a memory controller configured to control the non-volatile memory device,
wherein the non-volatile memory device comprises:
- a memory cell array comprising a string selection line, a ground selection line, first through N-th word lines disposed between the ground selection line and the string selection line, a plurality of bit lines and non-volatile multi-level memory cells connected between the first through N-th word lines and the bit lines, where N is an integer greater than 2; and
- an access circuit configured to read data from a second memory cell connected to word line (WL) adjacent to an K-th WL in response to a read command directed to a first memory cell connected to the K-th WL, wherein K is an integer greater than or equal to 1 and smaller than or equal to N−1, and the first memory cell is capable of being programmed to an erase state, a first programmed state, a second programmed state, and a third programmed state, and the access circuit is further configured in response to a data read from the second memory cell to select a first read voltage selected from a first group of read voltages when discriminating between the erase state and the first programmed state and select a second read voltage selected from a second group of read voltages when discriminating between the second programmed state and the third programmed state, wherein a number of read voltages in the first group of read voltages is greater than the second group of read voltages.

15. The memory system of claim 14, wherein the memory system is one selected from the group consisting of a memory card, a memory drive and a solid state drive (SSD).

* * * * *